(12) United States Patent
Liu et al.

(10) Patent No.: US 8,228,729 B2
(45) Date of Patent: Jul. 24, 2012

(54) STRUCTURE AND METHOD FOR SHUFFLING DATA WITHIN NON-VOLATILE MEMORY DEVICES

(75) Inventors: Bo Liu, Milpitas, CA (US); Yan Li, Milpitas, CA (US); Alexander Kwok-Tung Mak, Los Altos Hills, CA (US); Chi-Ming Wang, Fremont, CA (US); Eugene Jinglun Tam, Saratoga, CA (US); Kwang-Ho Kim, Pleasanton, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/333,494

(22) Filed: Dec. 21, 2011

(65) Prior Publication Data

US 2012/0113716 A1 May 10, 2012

Related U.S. Application Data

(60) Division of application No. 12/635,449, filed on Dec. 10, 2009, now Pat. No. 8,102,705, which is a continuation-in-part of application No. 12/478,997, filed on Jun. 5, 2009, now Pat. No. 8,027,195.

(51) Int. Cl.
*G11C 16/04* (2006.01)
*G11C 7/10* (2006.01)
(52) U.S. Cl. ......... 365/185.03; 365/189.17; 365/189.05; 365/185.18
(58) Field of Classification Search ............. 365/185.03, 365/185.09, 185.12, 189.05, 189.15, 189.16, 365/189.17, 189.2
See application file for complete search history.

(56) References Cited

U.S. PATENT DOCUMENTS

| 3,710,348 | A | 1/1973 | Craft |
| 3,895,360 | A | 7/1975 | Cricchi et al. |
| 4,357,685 | A | 11/1982 | Daniele et al. |
| 4,426,688 | A | 1/1984 | Moxley |

(Continued)

FOREIGN PATENT DOCUMENTS

CN 1549133 11/2004

(Continued)

OTHER PUBLICATIONS

Eitan et al., "NROM: A Novel Localized Trapping, 2-Bit Nonvolatile Memory Cell," *IEEE Electron Device Letters*, vol. 21, No. 11, Nov. 2000, pp. 543-545.

(Continued)

*Primary Examiner* — Anh Phung
*Assistant Examiner* — Hai Pham
(74) *Attorney, Agent, or Firm* — Davis Wright Tremaine LLP

(57) ABSTRACT

Techniques for the reading and writing of data in multi-state non-volatile memories are described. Data is written into the memory in a binary format, read into the data registers on the memory, and "folded" within the registers, and then written back into the memory in a multi-state format. In the folding operation, binary data from a single word line is folded into a multi-state format and, when rewritten in multi-state form, is written into a only a portion of another word line. A corresponding reading technique, where the data is "unfolded" is also described. A register structure allowing such a "folding" operation is also presented. One set of embodiments include a local internal data bus that allows data to between the registers of different read/write stacks, where the internal bus can used in the internal data folding process.

9 Claims, 22 Drawing Sheets

U.S. PATENT DOCUMENTS

| | | |
|---|---|---|
| 4,720,815 A | 1/1988 | Ogawa |
| 4,757,477 A | 7/1988 | Nagayama et al. |
| 5,070,032 A | 12/1991 | Yuan et al. |
| 5,095,344 A | 3/1992 | Harari |
| 5,172,338 A | 12/1992 | Mehrotra et al. |
| 5,200,959 A | 4/1993 | Gross et al. |
| 5,270,979 A | 12/1993 | Harari et al. |
| 5,313,421 A | 5/1994 | Guterman et al. |
| 5,315,541 A | 5/1994 | Harari et al. |
| 5,343,063 A | 8/1994 | Yuan et al. |
| 5,380,672 A | 1/1995 | Yuan et al. |
| 5,386,390 A | 1/1995 | Okitaka |
| 5,418,752 A | 5/1995 | Harari et al. |
| 5,428,621 A | 6/1995 | Mehrotra et al. |
| 5,430,679 A | 7/1995 | Hiltebeitel et al. |
| 5,430,859 A | 7/1995 | Norman et al. |
| 5,442,748 A | 8/1995 | Chang et al. |
| 5,479,370 A | 12/1995 | Furuyama et al. |
| 5,485,425 A | 1/1996 | Iwai et al. |
| 5,570,315 A | 10/1996 | Tanaka et al. |
| 5,595,924 A | 1/1997 | Yuan et al. |
| 5,602,987 A | 2/1997 | Harari et al. |
| 5,642,312 A | 6/1997 | Harari |
| 5,657,332 A | 8/1997 | Auclair et al. |
| 5,661,053 A | 8/1997 | Yuan |
| 5,663,901 A | 9/1997 | Wallace et al. |
| 5,712,180 A | 1/1998 | Guterman et al. |
| 5,768,192 A | 6/1998 | Eitan |
| 5,774,397 A | 6/1998 | Endoh et al. |
| 5,783,958 A | 7/1998 | Lysinger |
| 5,822,245 A | 10/1998 | Gupta et al. |
| 5,848,009 A | 12/1998 | Lee et al. |
| 5,862,080 A | 1/1999 | Harari et al. |
| 5,890,192 A | 3/1999 | Lee et al. |
| 5,903,495 A | 5/1999 | Takeuchi et al. |
| 5,930,167 A | 7/1999 | Lee et al. |
| 5,936,971 A | 8/1999 | Harari et al. |
| 6,011,725 A | 1/2000 | Eitan |
| 6,021,463 A | 2/2000 | Belser |
| 6,038,167 A | 3/2000 | Miwa et al. |
| 6,038,184 A | 3/2000 | Naritake |
| 6,046,935 A | 4/2000 | Takeuchi et al. |
| 6,091,666 A | 7/2000 | Arase et al. |
| 6,151,248 A | 11/2000 | Harari et al. |
| 6,222,762 B1 | 4/2001 | Guterman et al. |
| 6,230,233 B1 | 5/2001 | Lofgren et al. |
| 6,252,800 B1 | 6/2001 | Chida |
| 6,266,273 B1 | 7/2001 | Conley et al. |
| 6,282,624 B1 | 8/2001 | Kimura et al. |
| 6,353,553 B1 | 3/2002 | Tamada et al. |
| 6,426,893 B1 | 7/2002 | Conley et al. |
| 6,456,528 B1 | 9/2002 | Chen |
| 6,480,423 B2 | 11/2002 | Toda et al. |
| 6,510,488 B2 | 1/2003 | Lasser |
| 6,512,263 B1 | 1/2003 | Yuan et al. |
| 6,522,580 B2 | 2/2003 | Chen et al. |
| 6,523,132 B1 | 2/2003 | Harari et al. |
| 6,560,146 B2 | 5/2003 | Cernea |
| 6,567,307 B1 | 5/2003 | Estakhri |
| 6,581,142 B1 | 6/2003 | Jacobs |
| 6,594,177 B2 | 7/2003 | Matarrese et al. |
| 6,643,180 B2 | 11/2003 | Ikehashi et al. |
| 6,657,891 B1 | 12/2003 | Shibata et al. |
| 6,771,536 B2 | 8/2004 | Li et al. |
| 6,813,184 B2 | 11/2004 | Lee |
| 6,853,596 B2 | 2/2005 | Cheung |
| 6,870,768 B2 | 3/2005 | Cernea et al. |
| 6,990,018 B2 | 1/2006 | Tanaka et al. |
| 7,027,330 B2 | 4/2006 | Park |
| 7,039,781 B2 | 5/2006 | Iwata et al. |
| 7,057,339 B2 | 6/2006 | Boroson et al. |
| 7,058,818 B2 | 6/2006 | Dariel |
| 7,076,611 B2 | 7/2006 | Steere et al. |
| 7,110,294 B2 | 9/2006 | Kawai |
| 7,158,421 B2 | 1/2007 | Li et al. |
| 7,170,802 B2 | 1/2007 | Cernea et al. |
| 7,206,230 B2 | 4/2007 | Li et al. |
| 7,224,605 B1 | 5/2007 | Moogat et al. |
| 7,299,314 B2 | 11/2007 | Lin et al. |
| 7,310,347 B2 | 12/2007 | Lasser |
| 7,345,928 B2 | 3/2008 | Li |
| 7,405,985 B2 | 7/2008 | Cernea et al. |
| 7,420,847 B2 | 9/2008 | Li |
| 7,426,623 B2 | 9/2008 | Lasser |
| 7,447,070 B2 | 11/2008 | Cernea |
| 7,490,283 B2 | 2/2009 | Gorobets et al. |
| 7,493,457 B2 | 2/2009 | Murin |
| 7,502,254 B2 | 3/2009 | Murin et al. |
| 7,502,259 B2 | 3/2009 | Gorobets |
| 2001/0000023 A1 | 3/2001 | Kawahara et al. |
| 2003/0007385 A1 | 1/2003 | Hosono et al. |
| 2003/0182317 A1 | 9/2003 | Kahn et al. |
| 2003/0223274 A1 | 12/2003 | Cernea |
| 2004/0060031 A1 | 3/2004 | Cernea |
| 2004/0109357 A1 | 6/2004 | Cernea et al. |
| 2005/0144365 A1 | 6/2005 | Gorobets et al. |
| 2005/0213393 A1 | 9/2005 | Lasser |
| 2006/0126390 A1 | 6/2006 | Gorobets et al. |
| 2006/0136656 A1 | 6/2006 | Conley et al. |
| 2006/0140007 A1 | 6/2006 | Cernea et al. |
| 2007/0061502 A1 | 3/2007 | Lasser et al. |
| 2007/0065119 A1 | 3/2007 | Pomerantz |
| 2007/0091677 A1 | 4/2007 | Lasser et al. |
| 2007/0103977 A1 | 5/2007 | Conley et al. |
| 2007/0103978 A1 | 5/2007 | Conley et al. |
| 2007/0159652 A1 | 7/2007 | Sato |
| 2007/0180346 A1 | 8/2007 | Murin |
| 2007/0211530 A1 | 9/2007 | Nakano |
| 2007/0220197 A1 | 9/2007 | Lasser |
| 2007/0220935 A1 | 9/2007 | Cernea |
| 2007/0237006 A1 | 10/2007 | Murin et al. |
| 2007/0260808 A1 | 11/2007 | Raines et al. |
| 2007/0268745 A1 | 11/2007 | Lasser |
| 2007/0283081 A1 | 12/2007 | Lasser |
| 2007/0285980 A1 | 12/2007 | Shimizu et al. |
| 2008/0062761 A1 | 3/2008 | Tu et al. |
| 2008/0104312 A1 | 5/2008 | Lasser |
| 2008/0147996 A1 | 6/2008 | Jenkins et al. |
| 2008/0159012 A1 | 7/2008 | Kim |
| 2008/0181000 A1 | 7/2008 | Lasser |
| 2008/0209112 A1 | 8/2008 | Yu et al. |
| 2008/0244338 A1 | 10/2008 | Mokhlesi et al. |
| 2008/0244367 A1 | 10/2008 | Chin et al. |
| 2008/0250220 A1 | 10/2008 | Ito |
| 2008/0250300 A1 | 10/2008 | Mokhlesi et al. |
| 2008/0301532 A1 | 12/2008 | Uchikawa et al. |
| 2009/0067244 A1 | 3/2009 | Li et al. |
| 2009/0089481 A1 | 4/2009 | Kapoor et al. |
| 2009/0089520 A1 | 4/2009 | Saha et al. |
| 2009/0094482 A1 | 4/2009 | Zilberman |
| 2009/0172498 A1 | 7/2009 | Shlick et al. |
| 2010/0107004 A1 | 4/2010 | Bottelli et al. |
| 2010/0157641 A1 | 6/2010 | Shalvi et al. |
| 2010/0172179 A1 | 7/2010 | Gorobets et al. |
| 2010/0172180 A1 | 7/2010 | Paley et al. |
| 2010/0174845 A1 | 7/2010 | Gorobets et al. |
| 2010/0174846 A1 | 7/2010 | Paley et al. |
| 2010/0174847 A1 | 7/2010 | Paley et al. |
| 2011/0063909 A1 | 3/2011 | Komatsu |
| 2011/0099460 A1 | 4/2011 | Dusija et al. |
| 2011/0149650 A1 | 6/2011 | Huang et al. |
| 2011/0153912 A1 | 6/2011 | Gorobets |
| 2011/0153913 A1 | 6/2011 | Huang et al. |

FOREIGN PATENT DOCUMENTS

| | | |
|---|---|---|
| JP | 61292747 A | 12/1986 |
| JP | 1128297 | 5/1989 |
| JP | 06150666 A | 5/1994 |
| WO | WO 98/44420 | 10/1998 |
| WO | WO 00/49488 | 8/2000 |
| WO | WO 03/025939 A2 | 3/2003 |
| WO | WO 03/027828 | 4/2003 |
| WO | WO 2006/064318 | 6/2006 |
| WO | WO 2007/141783 | 12/2007 |

OTHER PUBLICATIONS

U.S. Appl. No. 61/142,620 entitled "Non-Volatile Memory and Method With Improved Block Management System," filed Jan. 5, 2009, 144 pages.

U.S. Appl. No. 12/348,819 entitled "Wear Leveling for Non-Volatile Memories: Maintenance of Experience Count and Passive Techniques," filed Jan. 5, 2009, 73 pages.

U.S. Appl. No. 12/348,825 entitled "Spare Block Management in Non-Volatile Memories," filed Jan. 5, 2009, 76 pages.

U.S. Appl. No. 12/348,891 entitled "Non-Volatile Memory and Method With Write Cache Partitioning," filed Jan. 5, 2009, 151 pages.

U.S. Appl. No. 12/348,895 entitled "Nonvolatile Memory With Write Cache Having Flush/Eviction Methods," filed Jan. 5, 2009, 151 pages.

U.S. Appl. No. 12/348,899 entitled "Non-Volatile Memory and Method With Write Cache Partition Management Methods," filed Jan. 5, 2009, 149 pages.

U.S. Appl. No. 12/051,462 entitled "Adaptive Algorithm in Cache Operation with Dynamic Data Latch Requirements," filed Mar. 19, 2008, 20 pages.

U.S. Appl. No. 12/051,492 entitled "Different Combinations of Wordline Order and Look-Ahead Read to Improve Flash Memory Performance," filed Mar. 19, 2008, 20 pages.

U.S. Appl. No. 12/478,997 entitled Folding Data Stored in Binary Format into Multi-State Format Within Non-Volatile Devices, filed Jun. 5, 2009, 52 pages.

"Numonyx Sector-Based Compact File System (SCFS) Software is a Feature-Rich Flash Solution," *Numonyx*, 2009, 2 pages.

"SanDisk, Toshiba Develop 32-Nanometer NAND Flash Technology," *SanDisk Corporation and Toshiba Corporation*, Feb. 11, 2009, www.physorg.com/news153597019.html, 9 pages.

U.S. Appl. No. 12/642,740 entitled "Atomic Program Sequence and Write Abort Detection," filed Dec. 18, 2009, 60 pages.

Choudhuri et al., "Performance Improvement of Block Based NAND Flash Translation Layer," CODES + ISSS '07, Salzburg, Austria, pp. 257-262.

Office Action for U.S. Appl. No. 12/478,997 mailed Jan. 25, 2011, 57 pages.

Notification of Transmittal of the International Search Report and the Written Opinion of the International Searching Authority, or the Declaration for International Application No. PCT/US2010/034378 mailed Sep. 1, 2010, 15 pages.

Notification Concerning Transmittal of International Preliminary Report for European Patent Application No. PCT/US2010/034378 dated Dec. 15, 2011, 9 pages.

Input Logic Truth Table

| Transfer Mode | ONE | ONEB<0> | ONEB<1> | PBus (Input) | BSI (Output) |
|---|---|---|---|---|---|
| Pass-Through | 1 | 0 | 0 | PBus | PBus |
| Invert | 0 | 1 | 1 | PBus | PBus* |
| Float | 1 | 1 | 0 | PBus | Float |

Output Logic Truth Table

| Transfer Mode | PINV | NINV | PDIR | NDIR | MTCH | PBus (Output) |
|---|---|---|---|---|---|---|
| Pass-Through | D | D | D | 1 | 0 | 0 |
|  | 0 | D | D | D | 1 | 1 |
| Invert | D | D | 0 | D | 0 | 1 |
|  | D | 1 | D | D | 1 | 0 |
| Float | D | D | D | D | X | Z |
| Pre-Charge | 0 | D | 0 | D | X | 1 |

(Default Values: PINV=1, NINV=0, PDIR=1, NDIR=0)

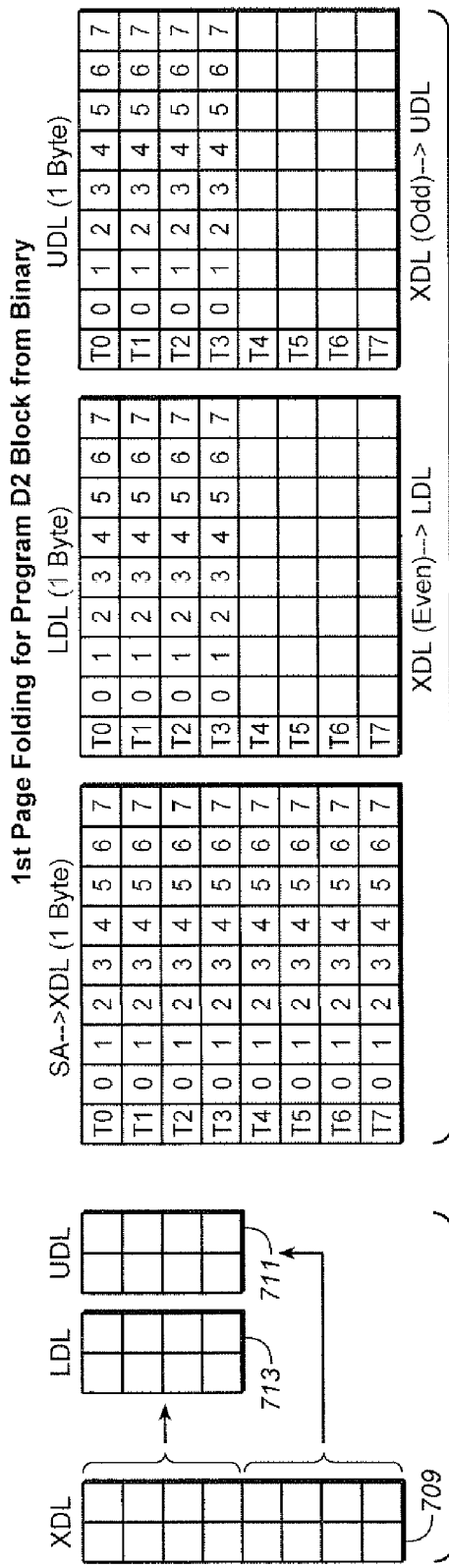
FIG. 16A
FIG. 16B
FIG. 16C

Initial Data

| Latch | S0 | S1 | S2 |
|---|---|---|---|
| SA | L2 | M2 | U2 |
| ADL | L0 | M0 | U0 |
| BDL | L1 | M1 | U1 |
| CDL | L2 | M2 | U2 |
| XDL | L2 | M2 | U2 |

*FIG. 21A*

Step1: ADL S2 to XDL S0

| Latch | S0 | S1 | S2 |
|---|---|---|---|
| SA | L2 | M2 | U2 |
| ADL | L0 | M0 | U0 |
| BDL | L1 | M1 | U1 |
| CDL | L2 | M2 | U2 |
| XDL | U0 | M2 | U2 |

*FIG. 21B*

Step2: BDL S2 to XDL S1

| Latch | S0 | S1 | S2 |
|---|---|---|---|
| SA | L2 | M2 | U2 |
| ADL | L0 | M0 | U0 |
| BDL | L1 | M1 | U1 |
| CDL | L2 | M2 | U2 |
| XDL | U0 | U1 | U2 |

*FIG. 21C*

Step3: XDL to CDL

| Latch | S0 | S1 | S2 |
|---|---|---|---|
| SA | L2 | M2 | U2 |
| ADL | L0 | M0 | U0 |
| BDL | L1 | M1 | U1 |
| CDL | U0 | U1 | U2 |
| XDL | U0 | U1 | U2 |

*FIG. 21D*

Step4: BDL to YBOX TMP

| Latch | S0 | S1 | S2 |
|---|---|---|---|
| SA | L2 | M2 | U2 |
| YBOX | L1 | M1 | U1 |
| ADL | L0 | M0 | U0 |
| BDL | L1 | M1 | U1 |
| CDL | U0 | U1 | U2 |
| XDL | U0 | U1 | U2 |

*FIG. 21E*

Step5: ADL S1 to XDL S0

| Latch | S0 | S1 | S2 |
|---|---|---|---|
| SA | L2 | M2 | U2 |
| YBOX | L1 | M1 | U1 |
| ADL | L0 | M0 | U0 |
| BDL | L1 | M1 | U1 |
| CDL | U0 | U1 | U2 |
| XDL | M0 | U1 | U2 |

*FIG. 21F*

Step6: SA S1 to XDL S2

| Latch | S0 | S1 | S2 |
|---|---|---|---|
| SA | L2 | M2 | U2 |
| YBOX | L1 | M1 | U1 |
| ADL | L0 | M0 | U0 |
| BDL | L1 | M1 | U1 |
| CDL | U0 | U1 | U2 |
| XDL | M0 | U1 | M2 |

*FIG. 21G*

Step7: BDL S1 to XDL S1

| Latch | S0 | S1 | S2 |
|---|---|---|---|
| SA | L2 | M2 | U2 |
| YBOX | L1 | M1 | U1 |
| ADL | L0 | M0 | U0 |
| BDL | L1 | M1 | U1 |
| CDL | U0 | U1 | U2 |
| XDL | M0 | M1 | M2 |

FIG. 21H

Step8: XDL to BDL

| Latch | S0 | S1 | S2 |
|---|---|---|---|
| SA | L2 | M2 | U2 |
| YBOX | L1 | M1 | U1 |
| ADL | L0 | M0 | U0 |
| BDL | M0 | M1 | M2 |
| CDL | U0 | U1 | U2 |
| XDL | M0 | M1 | M2 |

FIG. 21I

Step9: SA S0 to XDL S2

| Latch | S0 | S1 | S2 |
|---|---|---|---|
| SA | L2 | M2 | U2 |
| YBOX | L1 | M1 | U1 |
| ADL | L0 | M0 | U0 |
| BDL | M0 | M1 | M2 |
| CDL | U0 | U1 | U2 |
| XDL | M0 | M1 | L2 |

FIG. 21J

Step10: YBOX TMP S0 to XDL S1

| Latch | S0 | S1 | S2 |
|---|---|---|---|
| SA | L2 | M2 | U2 |
| YBOX | L1 | M1 | U1 |
| ADL | L0 | M0 | U0 |
| BDL | M0 | M1 | M2 |
| CDL | U0 | U1 | U2 |
| XDL | M0 | L1 | L2 |

FIG. 21K

Step11: ADL S0 to XDL S0

| Latch | S0 | S1 | S2 |
|---|---|---|---|
| SA | L2 | M2 | U2 |
| YBOX | L1 | M1 | U1 |
| ADL | L0 | M0 | U0 |
| BDL | M0 | M1 | M2 |
| CDL | U0 | U1 | U2 |
| XDL | L0 | L1 | L2 |

FIG. 21L

Step12: XDL to ADL

| Latch | S0 | S1 | S2 |
|---|---|---|---|
| SA | L2 | M2 | U2 |
| YBOX | L1 | M1 | U1 |
| ADL | L0 | L1 | L2 |
| BDL | M0 | M1 | M2 |
| CDL | U0 | U1 | U2 |
| XDL | L0 | L1 | L2 |

FIG. 21M

STRUCTURE AND METHOD FOR SHUFFLING DATA WITHIN NON-VOLATILE MEMORY DEVICES

CROSS-REFERENCE TO RELATED APPLICATIONS

This application is a divisional of U.S. application. Ser. No. 12/635,449, filed on Dec. 10, 2009, which is a continuation-in-part of U.S. application Ser. No. 12/478,997 filed on Jun. 5, 2009, which applications are incorporated herein by reference in their entirety for all purposes.

FIELD OF THE INVENTION

This invention relates generally to non-volatile semiconductor memory such as electrically erasable programmable read-only memory (EEPROM) and flash EEPROM and, more specifically, to techniques for rewriting data from a binary format into a multi-state format on such memory devices.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-Volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1-left and T1-right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1-left is being accessed, both the T2 and T1-right are turned on to allow the current in the T1-left's portion of the channel to pass between the source and the drain. Similarly, when the storage unit T1-right is being accessed, T2 and T1-left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, ... Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903,495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case; there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $T_{REF}$ of 2 µA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

FIG. 6A is a schematic block diagram of an individual read/write module 190. Essentially, during read or verify, a sense amplifier determines the current flowing through the drain of an addressed memory transistor connected via a selected bit line. The current depends on the charge stored in the memory transistor and its control gate voltage. For example, in a multi-state EEPROM cell, its floating gate can be charged to one of several different levels. For a 4-level cell, it may be used to store two bits of data. The level detected by the sense amplifier is converted by a level-to-bits conversion logic to a set of data bits to be stored in a data latch.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

Referring to FIG. 5, the read/write circuits 170 is organized into banks of read/write stacks 180. Each read/write stack 180 is a stack of read/write modules 190. In a memory array, the column spacing is determined by the size of the one or two transistors that occupy it. However, as can be seen from FIG. 6A, the circuitry of a read/write module will likely be implemented with many more transistors and circuit elements and therefore will occupy a space over many columns. In order to service more than one column among the occupied columns, multiple modules are stacked up on top of each other.

FIG. 6B shows the read/write stack of FIG. 5 implemented conventionally by a stack of read/write modules 190. For example, a read/write module may extend over sixteen columns, then a read/write stack 180 with a stack of eight read/write modules can be used to service eight columns in parallel. The read/write stack can be coupled via a column decoder to either the eight odd (1, 3, 5, 7, 9, 11, 13, 15) columns or the eight even (2, 4, 6, 8, 10, 12, 14, 16) columns among the bank.

As mentioned before, conventional memory devices improve read/write operations by operating in a massively parallel manner on all even or all odd bit lines at a time. This architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

United States Patent Publication No. US-2004-0060031-A1 discloses a high performance yet compact non-volatile memory device having a large block of read/write circuits to read and write a corresponding block of memory cells in parallel. In particular, the memory device has an architecture that reduces redundancy in the block of read/write circuits to a minimum. Significant saving in space as well as power is accomplished by redistributing the block of read/write modules into a block read/write module core portions that operate in parallel while interacting with a substantially smaller sets of common portions in a time-multiplexing manner. In particular, data processing among read/write circuits between a plurality of sense amplifiers and data latches is performed by a shared processor.

Therefore there is a general need for high performance and high capacity non-volatile memory. In particular, there is a need for a compact non-volatile memory with enhanced read and program performance having an improved processor that is compact and efficient, yet highly versatile for processing data among the read/writing circuits.

SUMMARY OF INVENTION

A non-volatile memory system including a non-volatile memory circuit having an array of non-volatile memory cells formed along a plurality of word lines and a plurality of bit lines, where the bit lines forming a plurality of subsets each connectable to a corresponding set of data registers is described. According to one set of aspects, data is written into a first plurality of memory cells along a first of the word lines in a binary format, the first plurality of memory cells being formed along a corresponding first plurality of bit lines. The data is read from the first plurality of memory cells into the sets of registers corresponding to the first plurality of bit lines and rearranged within the sets of registers, whereby the data is arranged into sets of registers corresponding to a second plurality of bit lines, the second plurality of bit lines being less than the first plurality of bit lines. The rearranged data is subsequently written from the registers corresponding to the second plurality of bit lines into a second plurality of memory cells along a second of the word lines and formed along the second set of bit lines in a multi-state format.

According to an additional set of aspects, data stored in an N-bit per cell format, where N>1, is read from a first plurality of memory cells along a first of the word lines, where the first plurality of memory cells are formed along a corresponding first plurality of bit lines. The N-bit per cell data read from each of the first plurality of memory cells is stored into a first register of the set of registers corresponding to the first plurality of bit lines, and the data from each of the first registers is rearranged in N other registers with the same set of registers. The data is then transferred out from these N other registers in the order in which the data was received on the memory prior to being stored on the memory.

According to another set of aspects, a non-volatile memory system includes a controller circuit and non-volatile memory circuit having an array of non-volatile memory cells formed along a plurality of word lines and a plurality of bit lines. Data is received at the controller and a corresponding error correction code for the data is generated. The data and the corresponding error correction code is transferred to the memory and written along a first of the word lines in a binary format. Within the memory, the data and the corresponding error correction code are subsequently rewritten along a second of the words lines in a multi-state format, where the corresponding error correction code is generated dependent upon how the data is arranged into multistate format.

In other aspects, a non-volatile memory circuit with a memory array having a plurality of non-volatile memory cells formed along a plurality of word lines and a plurality of bit lines is presented. It further has read circuitry connectable to the memory array, including a plurality of sense amps, each connectable to one or more of the bit lines to perform a binary read operation and write circuitry connectable to the memory array to perform a multi-state program operation. A data register stack is accessible to the read circuitry and the write circuitry and includes: a first register connectable to receive the output of the sense amp to receive and hold the output of a binary sensing operation on a first of the word lines from N or more bit line lines, N being an integer greater than one; N second registers connectable the first register for the transfer of content therebetween; and processing circuitry connectable to the first an second register, whereby values corresponding to the output of N binary sensing operations on the first word line held in the first register can each be transferred to a corresponding one of the N second registers for use in an N-bit per cell programming operation of a cell on a second of the word lines.

Additional aspects include a non-volatile memory circuit that includes a memory array having non-volatile memory cells formed along word lines and bit lines, read and write circuitry connectable to the memory array, and an input/output data bus connectable to the read and write circuitry for the transfer of data to and from the memory array. The read and write circuitry includes multiple read/write stacks, each connectable to a corresponding subset of the bit lines and each having: a sense amp connectable to the corresponding subset of bit lines; a stack bus; a set of data latches connected to the bus; a stack processing circuit connected to the stack bus for controlling the transfer of data along the stack bus between the data latches and the sense amp; and an input/output module connected to the input/output bus and the stack bus to transfer data between them. The read and write circuitry also includes an internal data bus connected between the stack buses of a subset of the read/write stacks, whereby data can be transferred between the data latches of different ones of the subset of the read/write stacks.

Further aspects present a method of operating a non-volatile memory system that includes a non-volatile memory circuit having an array of non-volatile memory cells formed along a plurality of word lines and a plurality of bit lines, where the bit lines form multiple subsets that are each connectable to a corresponding set of data registers. The method includes reading data stored in a binary format along a first word line in a first plurality of the memory cells formed along N of the subsets into a first register in each of the corresponding N sets of data registers. The method subsequently shuffles data between registers of the N sets of data registers along a local data bus. Additionally, the shuffled data can then be written from these registers in an N-bit per cell format into memory cells along a second word line.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 16A-C shows an example of the rearrangement of data between registers.

FIGS. 21A-M illustrate an exemplary sequence for data folding using the structure of FIG. 18.

DETAILED DESCRIPTION OF THE PREFERRED EMBODIMENTS

Figure 7A:
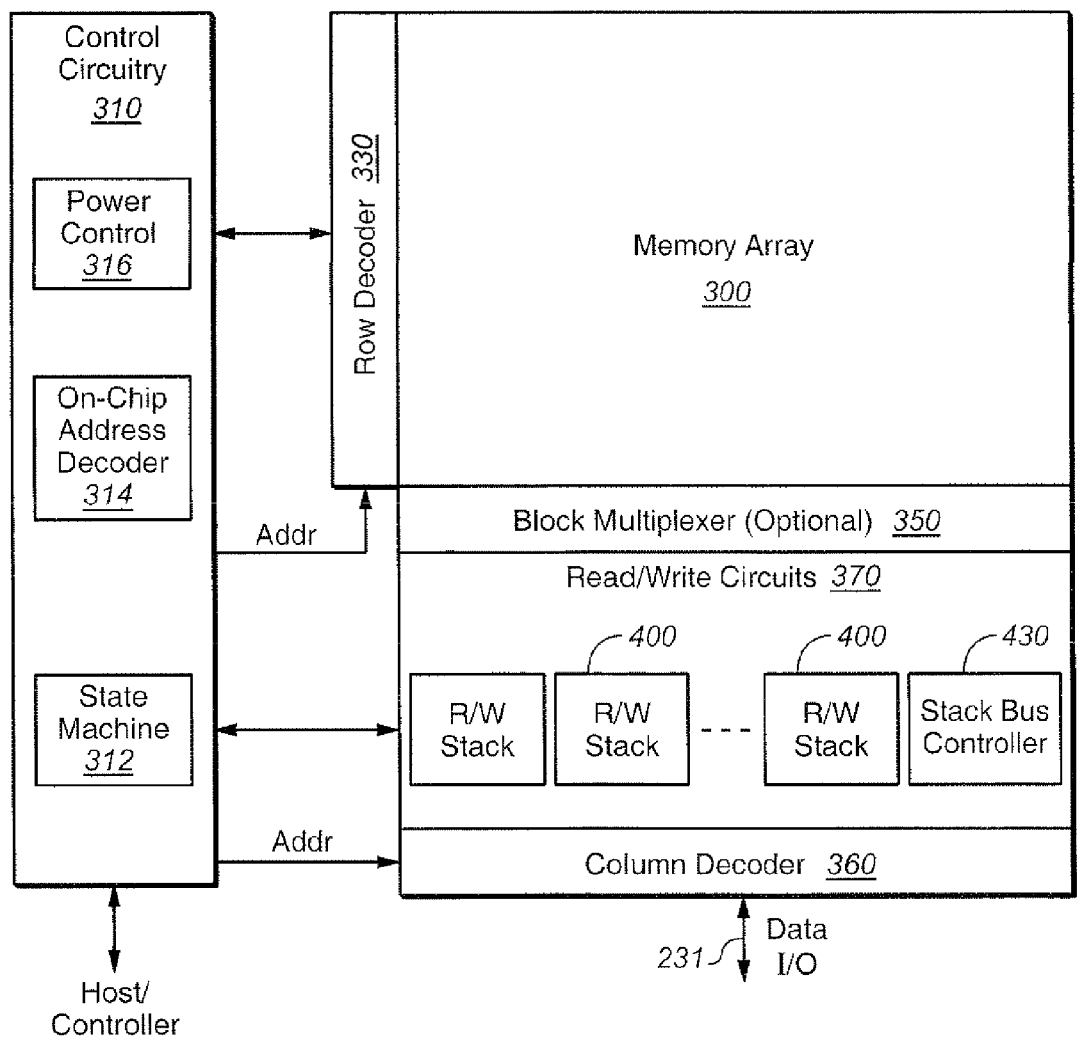
FIG. 7A illustrates schematically a compact memory device having a bank of partitioned read/write stacks, in which the improved processor of the present invention is implemented.

FIG. 7A illustrates schematically a compact memory device having a bank of partitioned read/write stacks, in which the improved processor of the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of partitioned read/write stacks 400 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 7B:
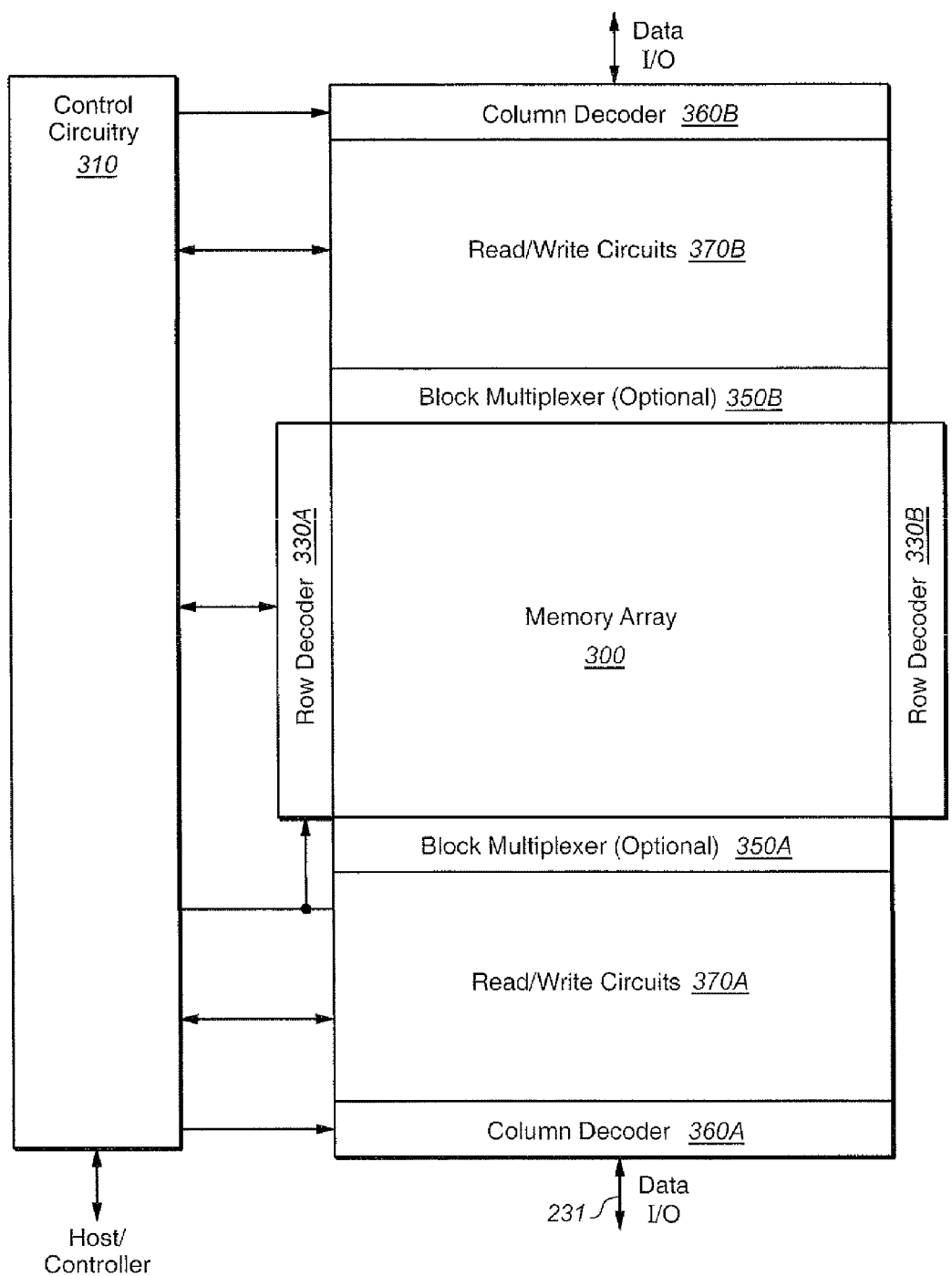
FIG. 7B illustrates a preferred arrangement of the compact memory device shown in FIG. 7A.

FIG. 7B illustrates a preferred arrangement of the compact memory device shown in FIG. 7A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the partitioned read/write stacks 400, is essentially reduced by one half.

Figure 8:
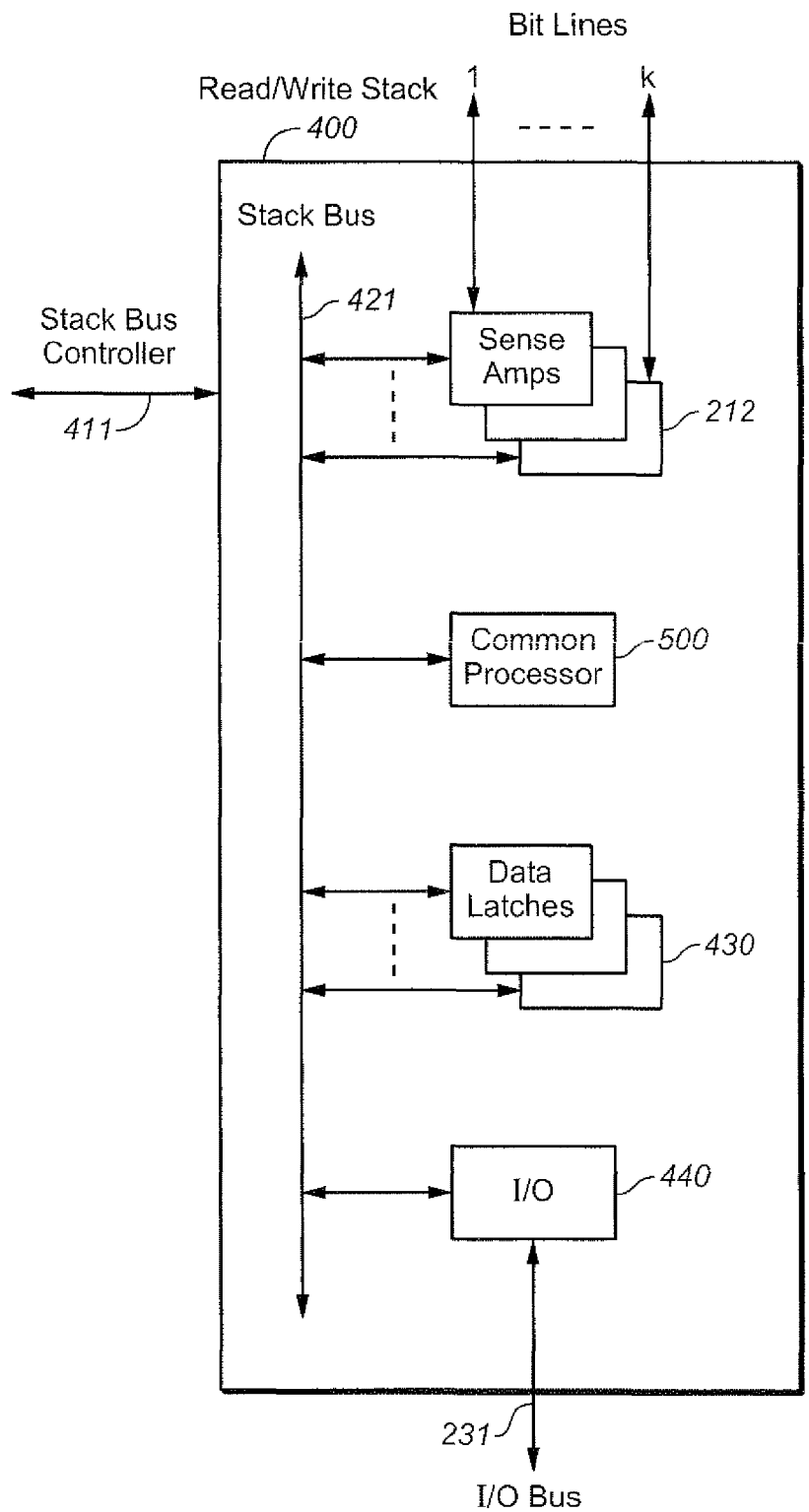
FIG. 8 illustrates schematically a general arrangement of the basic components in a read/write stack shown in FIG. 7A.

FIG. 8 illustrates schematically a general arrangement of the basic components in a read/write stack shown in FIG. 7A. According to a general architecture of the invention, the read/write stack 400 comprises a stack of sense amplifiers 212 for sensing k bit lines, an I/O module 440 for input or output of data via an I/O bus 231, a stack of data latches 430 for storing input or output data, a common processor 500 to process and store data among the read/write stack 400, and a stack bus 421 for communication among the stack components. A stack bus controller among the read/write circuits 370 provides control and timing signals via lines 411 for controlling the various components among the read/write stacks.

Figure 9:
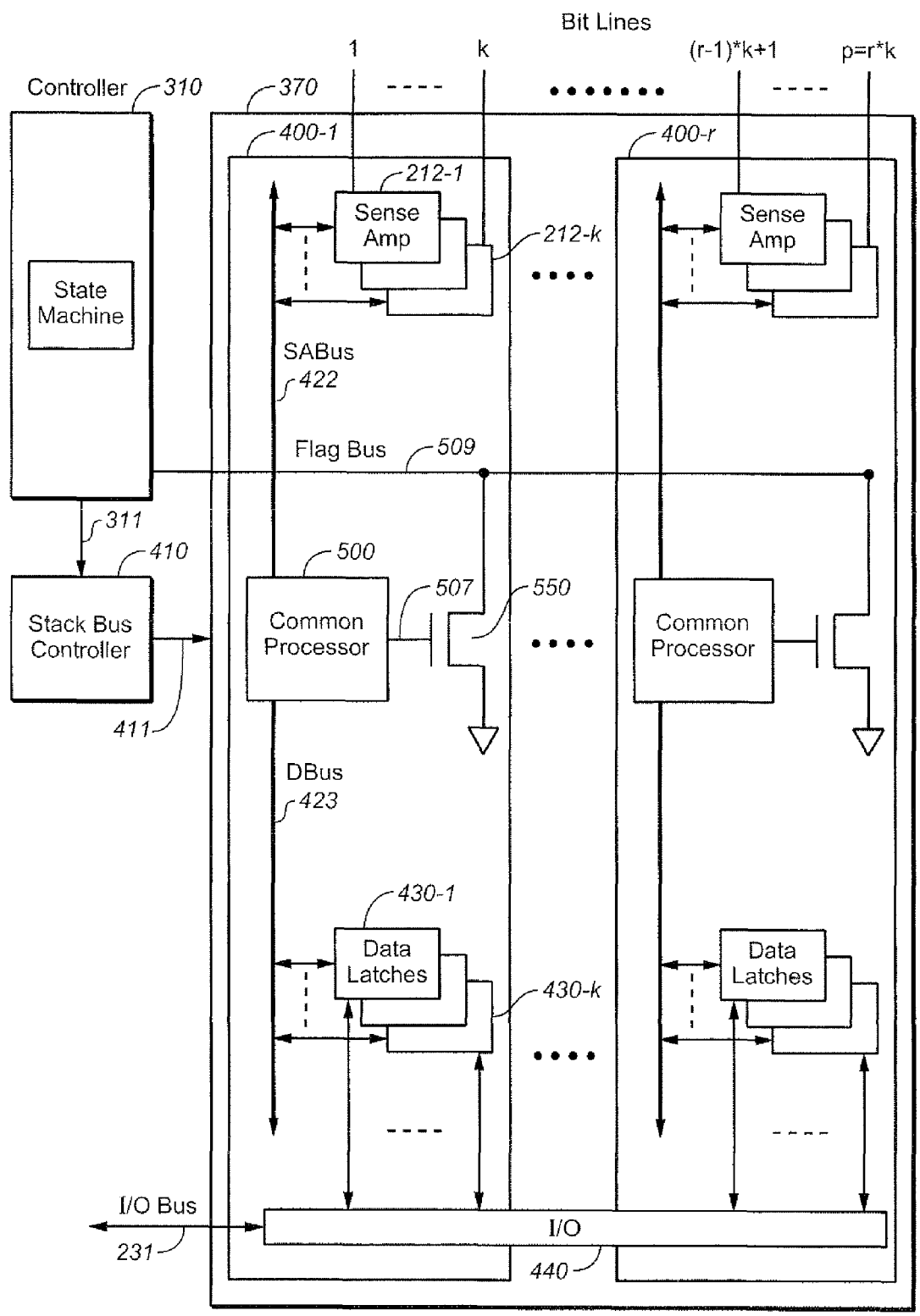
FIG. 9 illustrates one preferred arrangement of the read/write stacks among the read/write circuits shown in FIGS. 7A and 7B.

FIG. 9 illustrates one preferred arrangement of the read/write stacks among the read/write circuits shown in FIGS. 7A and 7B. Each read/write stack 400 operates on a group of k bit lines in parallel. If a page has p=r*k bit lines, there will be r read/write stacks, 400-1, . . . 400-r.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

Each read/write stack, such as 400-1, essentially contains a stack of sense amplifiers 212-1 to 212-k servicing a segment of k memory cells in parallel. A preferred sense amplifier is disclosed in United States Patent Publication No. 2004-0109357-A1, the entire disclosure of which is hereby incorporated herein by reference.

The stack bus controller 410 provides control and timing signals to the read/write circuit 370 via lines 411. The stack bus controller is itself dependent on the memory controller 310 via lines 311. Communication among each read/write stack 400 is effected by an interconnecting stack bus 431 and controlled by the stack bus controller 410. Control lines 411 provide control and clock signals from the stack bus controller 410 to the components of the read/write stacks 400-1.

In the preferred arrangement, the stack bus is partitioned into a SABus 422 for communication between the common processor 500 and the stack of sense amplifiers 212, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Figure 10:
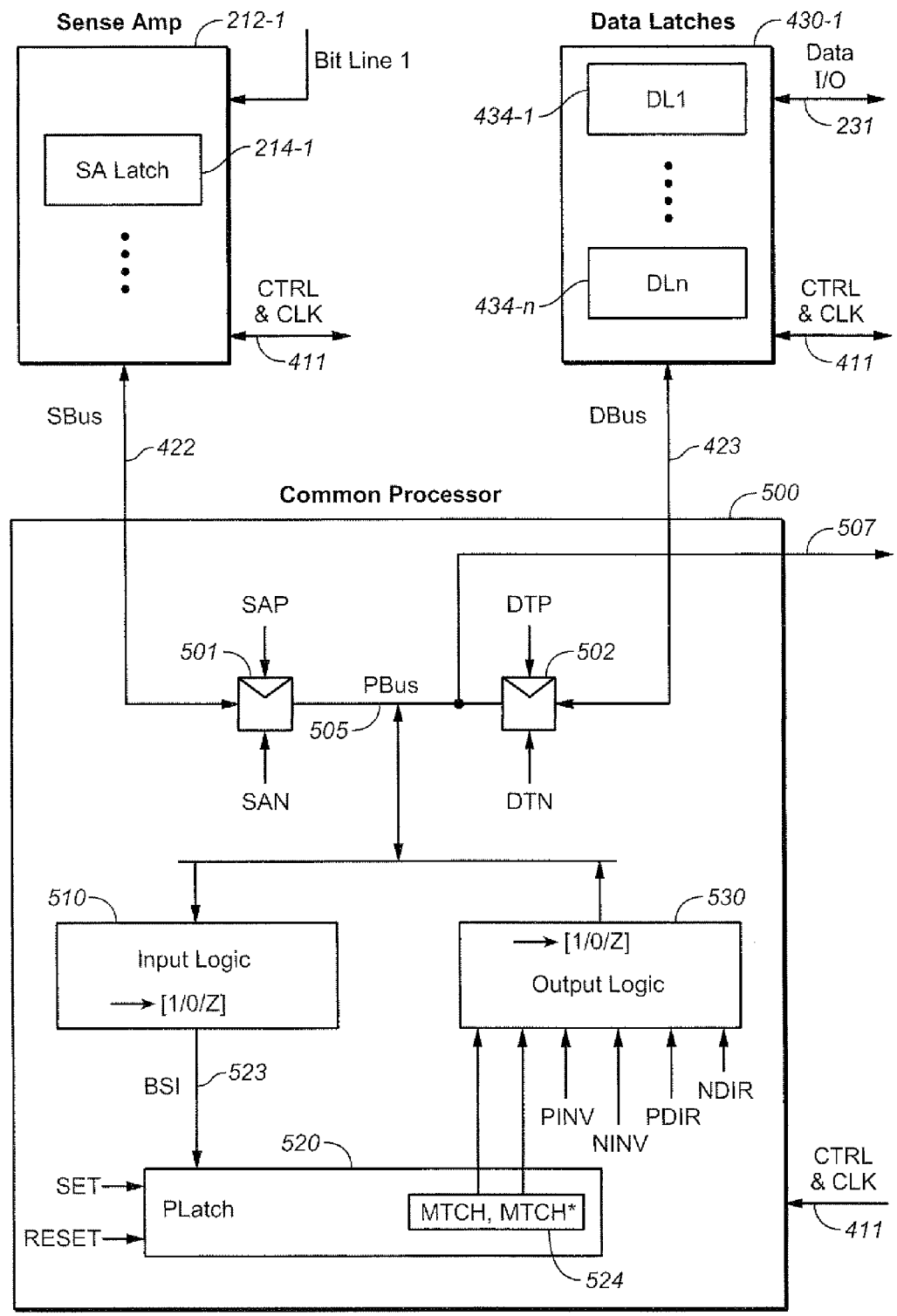
FIG. 10 illustrates an improved embodiment of the common processor shown in FIG. 9.

FIG. 10 illustrates an improved embodiment of the common processor shown in FIG. 9. The common processor 500 comprises a processor bus, PBUS 505 for communication with external circuits, an input logic 510, a processor latch PLatch 520 and an output logic 530.

The input logic 510 receives data from the PBUS and outputs to a BSI node as a transformed data in one of logical states "1", "0", or "Z" (float) depending on the control signals from the stack bus controller 410 via signal lines 411. A Set/Reset latch, PLatch 520 then latches BSI, resulting in a pair of complementary output signals as MTCH and MTCH*.

The output logic 530 receives the MTCH and MTCH* signals and outputs on the PBUS 505 a transformed data in one of logical states "1", "0", or "Z" (float) depending on the control signals from the stack bus controller 410 via signal lines 411.

At any one time the common processor 500 processes the data related to a given memory cell. For example, FIG. 10 illustrates the case for the memory cell coupled to bit line 1. The corresponding sense amplifier 212-1 comprises a node where the sense amplifier data appears. In the preferred embodiment, the node assumes the form of a SA Latch, 214-1 that stores data. Similarly, the corresponding set of data latches 430-1 stores input or output data associated with the memory cell coupled to bit line 1. In the preferred embodiment, the set of data latches 430-1 comprises sufficient data latches, 434-1, . . . , 434-n for storing n-bits of data.

The PBUS 505 of the common processor 500 has access to the SA latch 214-1 via the SBUS 422 when a transfer gate 501 is enabled by a pair of complementary signals SAP and SAN. Similarly, the PBUS 505 has access to the set of data latches 430-1 via the DBUS 423 when a transfer gate 502 is enabled by a pair of complementary signals DTP and DTN. The signals SAP, SAN, DTP and DTN are illustrated explicitly as part of the control signals from the stack bus controller 410.

Figures 11A, 11B:
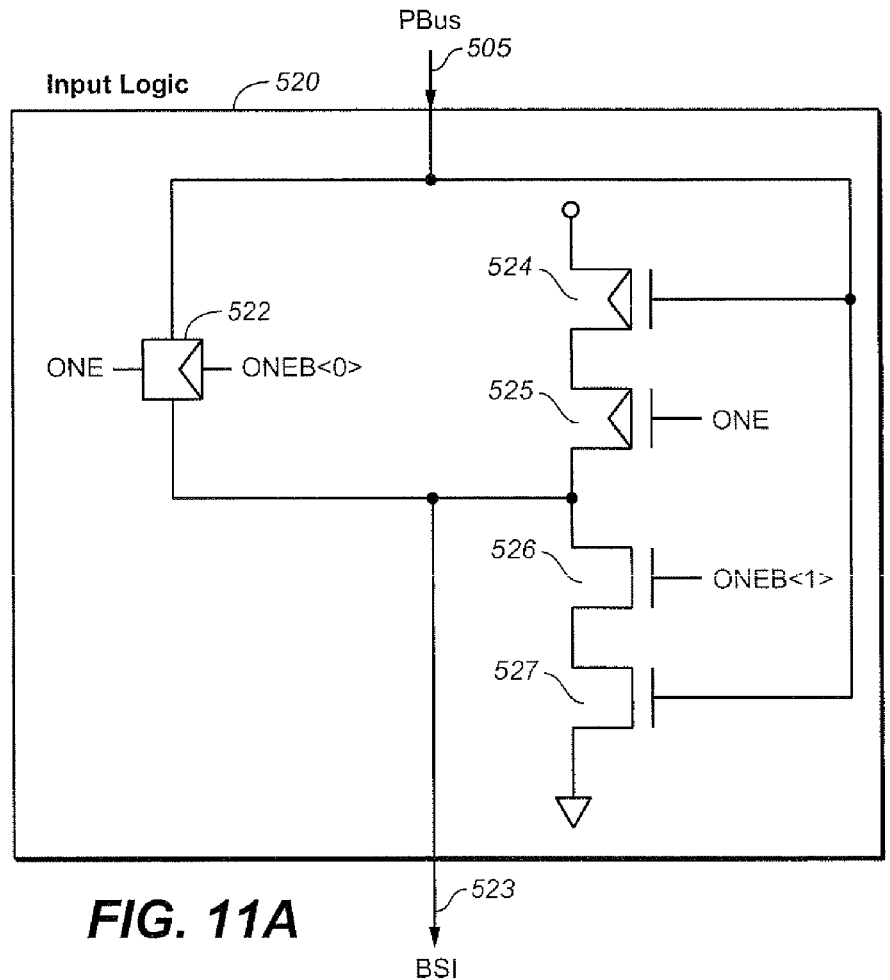
FIG. 11A illustrates a preferred embodiment of the input logic of the common processor shown in FIG. 10.
FIG. 11B illustrates the truth table of the input logic of FIG. 11A.

FIG. 11A illustrates a preferred embodiment of the input logic of the common processor shown in FIG. 10. The input logic 520 receives the data on the PBUS 505 and depending on the control signals, either has the output BSI being the same, or inverted, or floated. The output BSI node is essentially affected by either the output of a transfer gate 522 or a pull-up circuit comprising p-transistors 524 and 525 in series to Vdd, or a pull-down circuit comprising n-transistors 526 and 527 in series to ground. The pull-up circuit has the gates to the p-transistor 524 and 525 respectively controlled by the signals PBUS and ONE. The pull-down circuit has the gates to the n-transistors 526 and 527 respectively controlled by the signals ONEB<1> and PBUS.

FIG. 11B illustrates the truth table of the input logic of FIG. 11A. The logic is controlled by PBUS and the control signals ONE, ONEB<0>, ONEB<1> which are part of the control signals from the stack bus controller 410. Essentially, three transfer modes, PASSTHROUGH, INVERTED, and FLOATED, are supported.

In the case of the PASSTHROUGH mode where BSI is the same as the input data, the signals ONE is at a logical "1", ONEB<0> at "0" and ONEB<1> at "0". This will disable the pull-up or pull-down but enable the transfer gate 522 to pass the data on the PBUS 505 to the output 523. In the case of the INVERTED mode where BSI is the invert of the input data, the signals ONE is at "0", ONEB<0> at "1" and ONE<1> at "1". This will disable the transfer gate 522. Also, when PBUS is at "0", the pull-down circuit will be disabled while the pull-up circuit is enabled, resulting in BSI being at "1". Similarly, when PBUS is at "1", the pull-up circuit is disabled while the pull-down circuit is enabled, resulting in BSI being at "0". Finally, in the case of the FLOATED mode, the output BSI can be floated by having the signals ONE at "1", ONEB<0> at "1" and ONEB<1> at "0". The FLOATED mode is listed for completeness although in practice, it is not used.

Figures 12A, 12B:
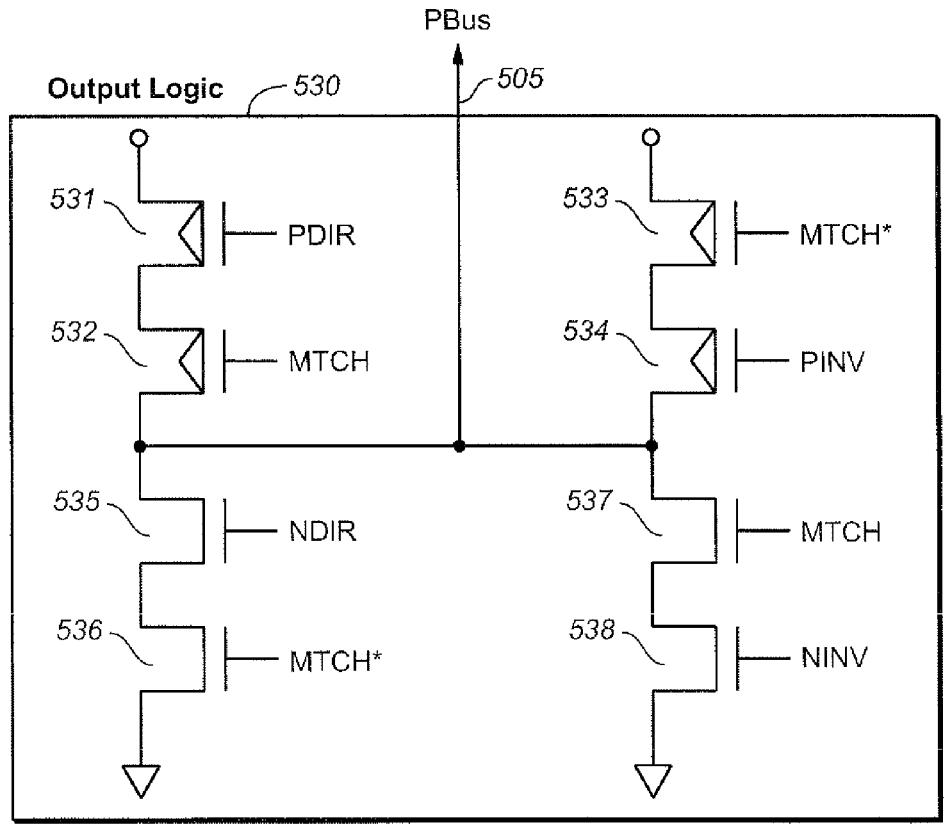
FIG. 12A illustrates a preferred embodiment of the output logic of the common processor shown in FIG. 10.
FIG. 12B illustrates the truth table of the output logic of FIG. 12A.

FIG. 12A illustrates a preferred embodiment of the output logic of the common processor shown in FIG. 10. The signal at the BSI node from the input logic 520 is latched in the processor latch, PLatch 520. The output logic 530 receives the data MTCH and MTCH* from the output of PLatch 520 and depending on the control signals, outputs on the PBUS as either in a PASSTHROUGH, INVERTED OR FLOATED mode. In other words, the four branches act as drivers for the PBUS 505, actively pulling it either to a HIGH, LOW or FLOATED state. This is accomplished by four branch circuits, namely two pull-up and two pull-down circuits for the PBUS 505. A first pull-up circuit comprises p-transistors 531 and 532 in series to Vdd, and is able to pull up the PBUS when MTCH is at "0". A second pull-up circuit comprises p-transistors 533 and 534 in series to ground and is able to pull up the PBUS when MTCH is at "1". Similarly, a first pull-down circuit comprises n-transistors 535 and 536 in series to Vdd, and is able to pull down the PBUS when MTCH is at "0". A second pull-up circuit comprises n-transistors 537 and 538 in series to ground and is able to pull up the PBUS when MTCH is at "1".

One feature of the invention is to constitute the pull-up circuits with PMOS transistors and the pull-down circuits with NMOS transistors. Since the pull by the NMOS is much stronger than that of the PMOS, the pull-down will always overcome the pull-up in any contentions. In other words, the node or bus can always default to a pull-up or "1" state, and if desired, can always be flipped to a "0" state by a pull-down.

FIG. 12B illustrates the truth table of the output logic of FIG. 12A. The logic is controlled by MTCH, MTCH* latched from the input logic and the control signals PDIR, PINV, NDIR, NINV, which are part of the control signals from the stack bus controller 410. Four operation modes, PASSTHROUGH, INVERTED, FLOATED, and PRECHARGE are supported.

In the FLOATED mode, all four branches are disabled. This is accomplished by having the signals PINV=1, NINV=0, PDIR=1, NDIR=0, which are also the default values. In the PASSTHROUGH mode, when MTCH=0, it will require PBUS=0. This is accomplished by only enabling the pull-down branch with n-transistors 535 and 536, with all control signals at their default values except for NDIR=1. When MTCH=1, it will require PBUS=1. This is accomplished by only enabling the pull-up branch with p-transistors 533 and 534, with all control signals at their default values except for PINV=0. In the INVERTED mode, when MTCH=0, it will require PBUS=1. This is accomplished by only enabling the pull-up branch with p-transistors 531 and 532, with all control signals at their default values except for PDIR=0. When MTCH=1, it will require PBUS=0. This is accomplished by only enabling the pull-down branch with n-transistors 537 and 538, with all control signals at their default values except for NINV=1. In the PRECHARGE mode, the control signals settings of PDIR=0 and PINV=0 will either enable the pull-up branch with p-transistors 531 and 531 when MTCH=1 or the pull-up branch with p-transistors 533 and 534 when MTCH=0.

Common processor operations are developed more fully in U.S. patent application Ser. No. 11/026,536, Dec. 29, 2004, which is hereby incorporated in its entirety by this reference.

On-Memory Folding of Data into Multi-State Format

The various sorts of non-volatile memories described above exist and can be operated in both binary forms and multi-state (or multi-level) forms. Some memory systems store data in both binary and multi-state formats; for example, as data can typically be written more quickly and with less critical tolerances in binary form, a memory may initial write data in binary form as it is received from a host and later rewrite this data in a multi-state format for greater storage density. In such memories, some cells may be used in binary format with others used in multi-state format, or the same cells may be operated to store differing numbers of bits. Examples of such systems are discussed in more detail in U.S. Pat. No. 6,456,528; US patent publication number 2009/0089481; and the following U.S. patent application No. 61/142,620; U.S. patent application Ser. Nos. 12/348,819; 12/348,825; 12/348,891; 12/348,895; and 12/348,899. The techniques described in this section relate to rewriting data from a binary format into a multi-state format in a "folding" process executed on the memory device itself, without the requirement of transferring the data back to the controller for reformatting. The on-memory folding process can also be used in a special way to manage error correction code (ECC) where the relative state of the data in the memory cell, when stored in multi-state form, is taken into account when considering that the most probable errors are transitions between the neighboring states. The system can also use ECC management which does not consider state information and manages ECC based on single page information, (Note that even though the ECC bits are programmed on the same set of physical cells as the data bits, the ECC is managed separately.)

More specifically, in the exemplary embodiment, as data is transferred from the controller to the memory, it is written along word lines of the memory array in a binary format. Subsequently, the data is then read into the registers associated with the array, where it is rearranged so that it can be written back into array in a multi-state form. To take the case of three bits per cell, for example, the content of three word lines would be each be read into the register structures, rearranged to correspond to the three bits that would be stored in each cell, and then rewritten back to a single word line of the array in a 3-bit per cell format. In the arrangement described here, the binary data content of a single word line is then end up on 1/Nth of a word line store in an N-bit per cell format. For cases where the eventual N-bit storage of the data uses an error correction code (ECC) that exploits the relation of the multi-states with a cell, this ECC can be determined in the controller and transferred along with the corresponding data and stored in the binary format prior to the data (and corresponding ECC) being rewritten in the multi-state format.

Figure 13:
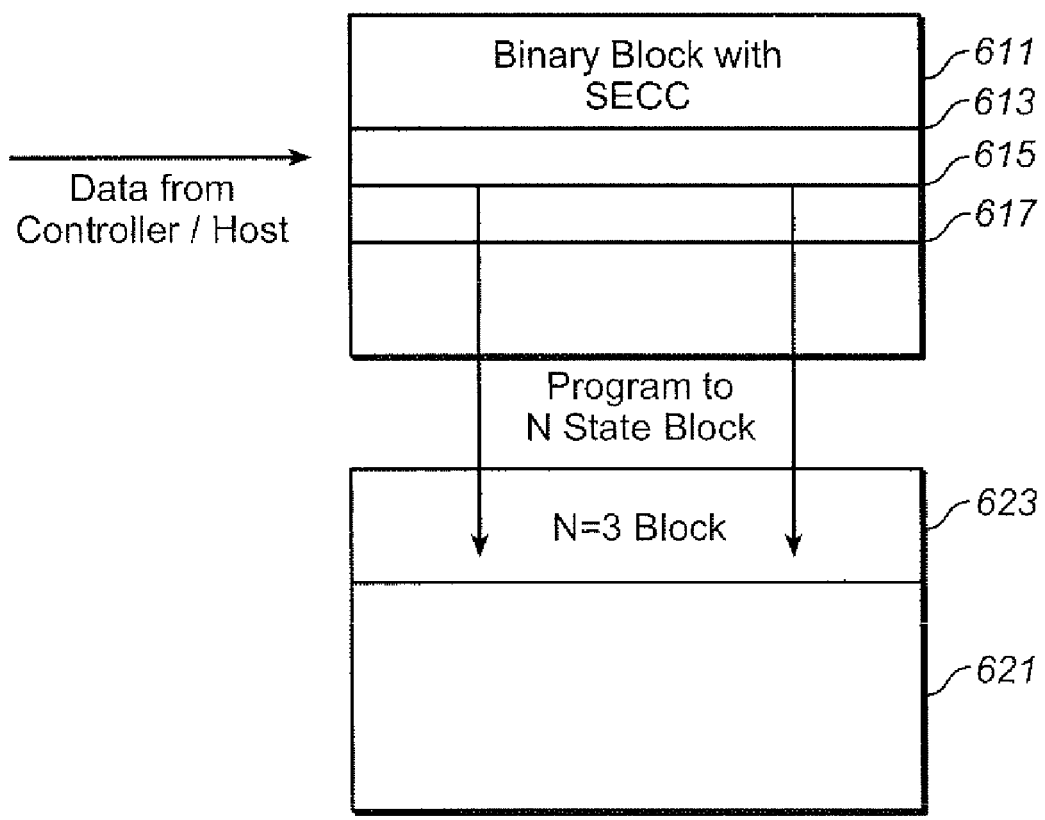
FIG. 13 outlines the on-memory folding process where the data from multiple word lines written in a binary format are rewritten into a multi-state format.

The idea of folding data from a binary to a multi-state, or MLC, format can be illustrated with FIG. 13 for a 3-bit per cell example. As shown by the arrow, data is received from the controller (or host) and written in binary format in a block 611 of the memory. Three of the written word lines (613, 615, 617) of the block 611 are explicitly shown. The content of these three word lines are then rewritten in a 3-bit per cell format along the single word line 623 of block 621, with the "folding" process accomplished on the memory itself. (More generally, if the data is written along 621 in an N-bit per cell format, the content of N-word lines of binary content would be folded up in this manner. This block 611 may specifically assigned to be operated in only binary mode or may be a block operable in a MLC mode by, for example, just the lowest page of multiple logical pages storable on a physical page. Similarly, block 621 may be assigned only for multi-state operation or may be operable in binary mode as well.

Figure 14:
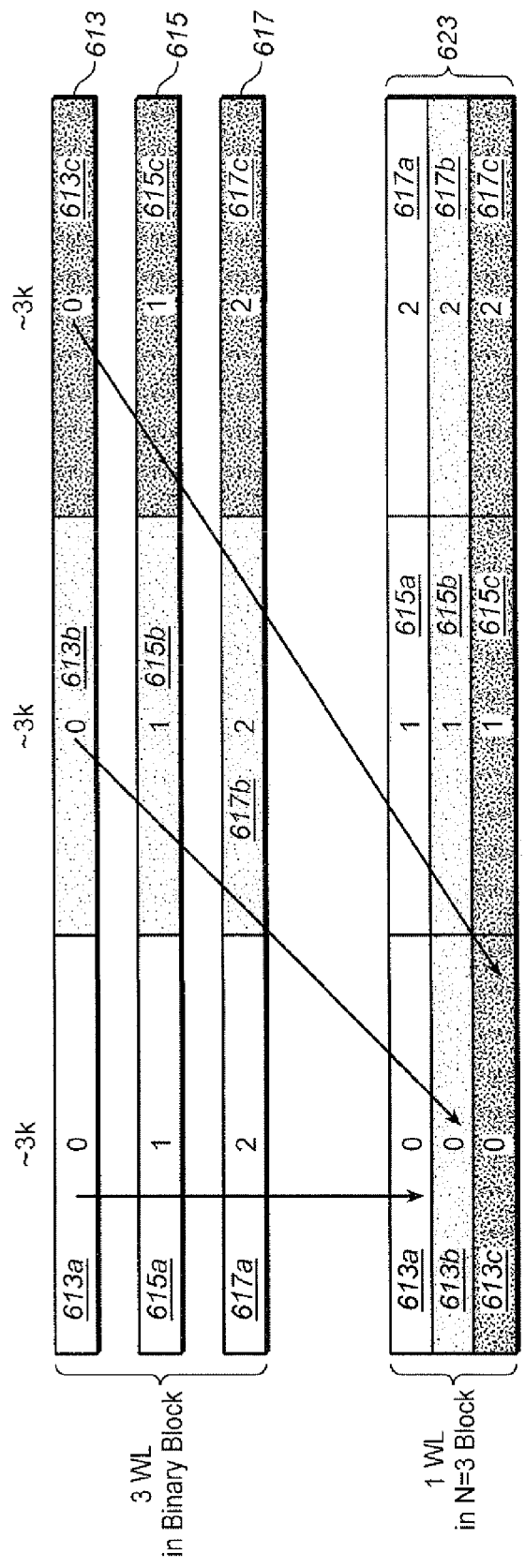
FIG. 14 illustrates aspects of the folding process in more detail.

Some detail on how the exemplary embodiment folds the data from the multiple binary format word lines into a single word line is shown in FIG. 14. At the top of FIG. 14 are the three word lines 613, 615, and 617, which are each split into three parts (a, b, c) of a third of the cells along a corresponding third of the bit lines (here taken as contiguous). On word line 623, the three thirds of the first word line (613a-c) are arranged onto to first third of the of the word line; similarly, the second binary word line 615 is folded and written into the middle third of 623 and the third word line from the binary block 617 is written into the last third of 623.

The process shown in FIG. 14 generalizes in a number of ways. A first of these is in the number of states stored per cell in the multi-state format. Although FIGS. 13 and 14 show the case where three pages of data are rewritten from three physical pages into multi-state format on a single physical page, other numbers of storage densities can be used. (For example, to simplify the following discussion, particularly that related to the register structure, the 2-bit per cell case will often be used as the exemplary embodiment.) Also, although full word lines (each here corresponding to a page) are shown, in system that allow partial page operation, partial pages may be used. (The writing of partial pages for the binary storage is discussed below and multi-state partial page operation is also possible, though generally not preferred as this can lead to more wear which can be problematic given the generally tighter tolerances of multi-state operation.) Additionally, although FIG. 14 shows the case where cells along the word line are split into groups along contiguous bit lines for folding, other arrangements can be used.

As noted above, the folding process is performed on the memory itself, so that once the data is transferred in from the controller (or host) and written in binary format, it is rewritten into the array without transferring it off the memory. The exemplary embodiments accomplish this by reading the data of the multiple binary word lines (e.g., 613, 615, 617) into the corresponding registers (or latches) associated with the array, rearranged within these registers into the form needed for multi-state programming, and then rewritten into a single word line (e.g., 623) of a multi-state block. Thus, under the arrangement of FIG. 14, the binary content of several (here 3) cells on the same word line, but along different bit lines, are read into the associated data registers, and then rearranged to correspond to the multi-bits of a single cell on a corresponding single bit line, from where it can be written.

Figure 15:
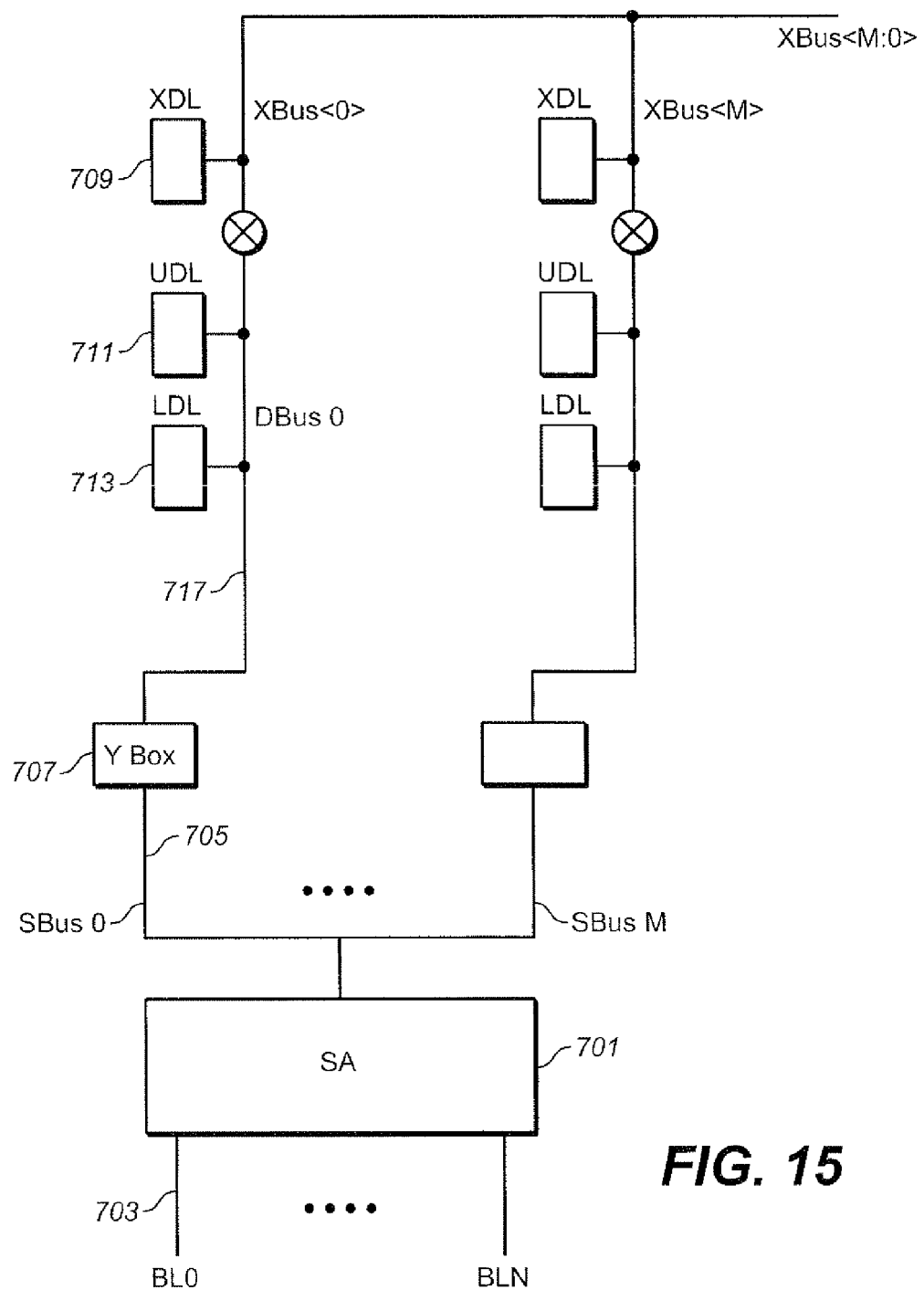
FIG. 15 is a block diagram of a register structure suitable for a folding operation.

More detail on register structures that can used in conjunction with the techniques described below can be found in U.S. Pat. Nos. 7,170,802; 7,420,847; 7,158,421; and 7,206,230; and U.S. patent application Ser. Nos. 12/051,462; and 12/051,492. For simplicity, the register structure will primarily be discussed with respect to the 2-bit per cell example. FIG. 15 is a block diagram that will be used to give some detail of an exemplary register structure and FIGS. 16A-C illustrates how data can be rearranged from binary to 2-bit format within this structure.

FIG. 15 roughly corresponds to the read/right stacks discussed above with respect to FIGS. 8-10, but highlights some of the elements more relevant for the present discussion in the 2-bit per cell context. A sense amp SA 701 is connectable to a number of bits lines (BL0-BLn) at bottom, such as BL0 703. Each bit line can have its content transferred out to one of the stacks along a corresponding stack bus (SBUS0-SBUSm), such as SBUS0 705, to the processing circuitry (YBOX 707 for SBUS0 705) that controls the bus. As discussed more in the referenced cited above, from YBOX 707 content can be transferred along bus DBUS 717 into the lower bit data latch LDL 713, the upper bit data latch UDL 711, or the data latch XDL 709. Under the exemplary embodiment, content can transfer between XDL 709 and either of UDL 711 and LDL 713, but only XDL 709 can transfer data to or from the external bus XBUS 715. This arrangement can be used with differing numbers of bit lines (the value of n in BLn) and differing numbers of register stacks (the value m in SBUSm), where m and n can be different. In principle any integer value can be used, but the arrangement is mainly designed for n being some integer multiple of m, where, when this integer is greater than 1, each of the registers will have (n/m) levels or tiers for entries in order to store the sense amp results for each of the multiple bit lines assigned to a given set of registers along a stack bus. FIGS. 16A-C uses the example of n=64 and m=8, so that the number of tiers is (n/m)=8. Although various values for n and m can be used, certain values (or ratios) of these numbers (based on number states used for multistate storage) more readily allow the folding process to be done, as discussed below.

FIGS. 16A-C illustrate an example of how the folding process can be executed within the registers associates with the array holding both the binary block 611 (FIG. 13) and multi-state block 621. In this example, there are eight sets of XDL/UDL/LDL registers (m=8), each having eight tiers (n/m=8) labeled T0-T7 in FIGS. 16B-C, with the eight columns corresponding to the values on each of the sets of XDL/UDL/LDL. Thus each row is a byte wide. FIG. 16A conceptually shows how an N=2 folding is executed: Once data is read in off of a word line into XDL 709, half of the rows are transferred into LDL 713 and the other half is transferred into UDL 711, from where it can be transferred as the lower and upper bits along a word line. As this will only half fill the available rows of LDL and UDL, XDL can be filled again and have its content transferred into LDL and UDL before programming begins. Note that as the number of row in XDL are split in half for the folding process, it is preferable if XDL has an even number of tiers. More generally, if the data is to be programmed into an N-bit format, it is preferable the number of register rows is a multiple of N; for example, for N=3 there could be 9 or 6 rows, while for N=4, 8 rows could again be used. For the folding process, 1/Nth of the rows from XDL would then be transferred out to the registers corresponding to each of the N multi-bits.

The folding of the data from XDL into LDL and UDL can be implemented in a number of ways. In FIG. 16B, this is done by reading in a page of data into the XDL registers, after which the byte-sized rows of the even tiers are put into the top four ties of LDL and the odd tiers are put into the top four rows of UDL. To fill out a physical page for 2-bit programming, in FIG. 16C data from a second binary page is read from the sense amp into XDL, the even tiers again transferred into LDL and the odd tiers into UDL. The transfer of data off the bit lines into the sense amps can be accomplished according to various pointer schemes, such as that described in U.S. Pat. No. 7,170,802, with perhaps the simplest version just a pointer that traverses all of the bit lines in order. Once the data is folded into multi-state format in the registers, it can then be programmed back into a block of the memory array, where the specifics of the multi-state programming can be as in any of the various references cited above. When data is read back out, the data can be unfolded to reverse the process of FIGS. 16A-C, with the data read out into the XDL register and then unfolded into the LDL and UDL registers so that it can then be transferred back off the memory. The data can then be shifted back off the memory in the same order or data structure in which it was initial shifted in from the host. (Note that the logical to physical address mapping may be changed by the folding and this needs to be accounted for accordingly.)

Going back to FIG. 13, under the folding process described above, the page of data along word line 613 is folded up in the register structure to be programmed onto only a third of word line 623, as shown schematically in FIG. 14. (It should be noted that FIG. 13 and FIG. 14 are for an N=3 embodiment.) A similar folding is also done for the data along word lines 615 and 617. In this way, binary data from three different data latches corresponding to bit lines along a single word line ends up being written in N=3 multi-state form on a single cell on a single bit line of word line 623. Alternately, the cells along a single bit line for each of the multiple word lines could be mapped onto the single cell on this same bit line along the word line 623, without the folding process described in the preceding paragraphs; however, the sort of on-memory folding arrangement presented in this section can effectively used when data written in multi-state format uses an error correction code (ECC) that exploits the physical relationship between the multi-states as stored on the cell. Even using more conventional ECC coding methods, the techniques presented here can enhance the ECC capabilities of the system.

Figure 1A:
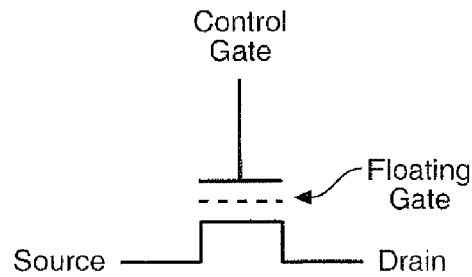
FIGS. 1A-1E illustrate schematically different examples of non-volatile memory cells.
Figure 1B:
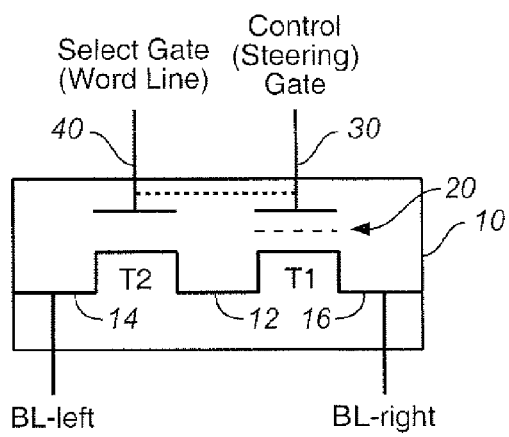
Figure 1C:
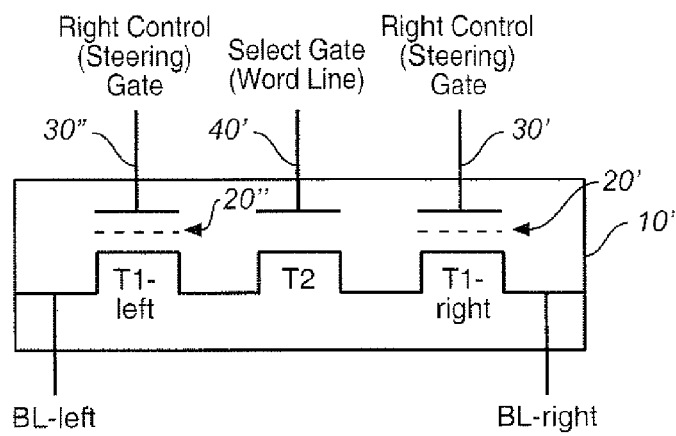
Figure 1D:
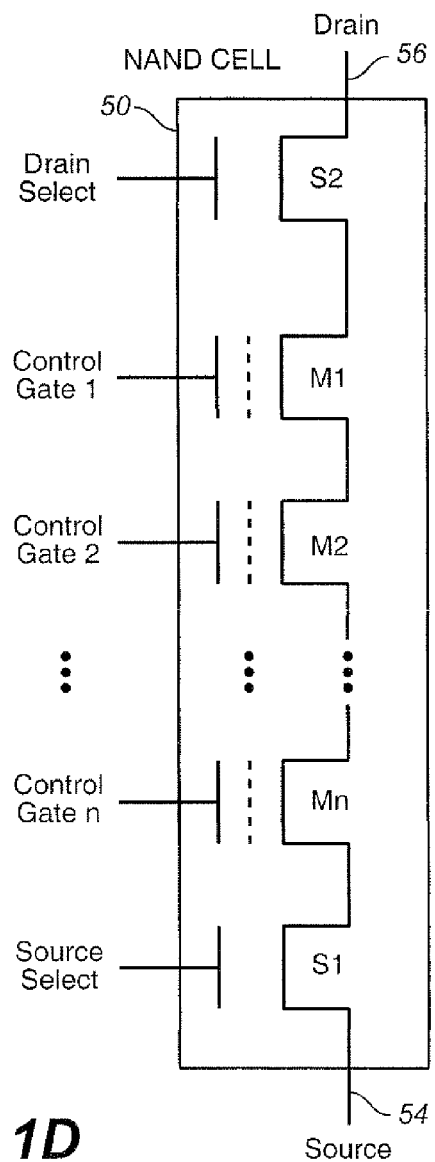
Figure 1E:
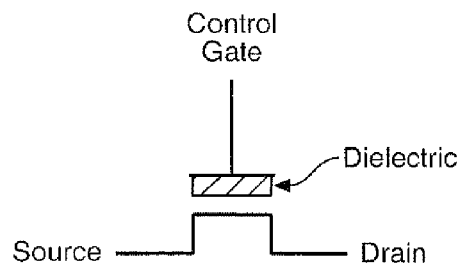
Figure 2:
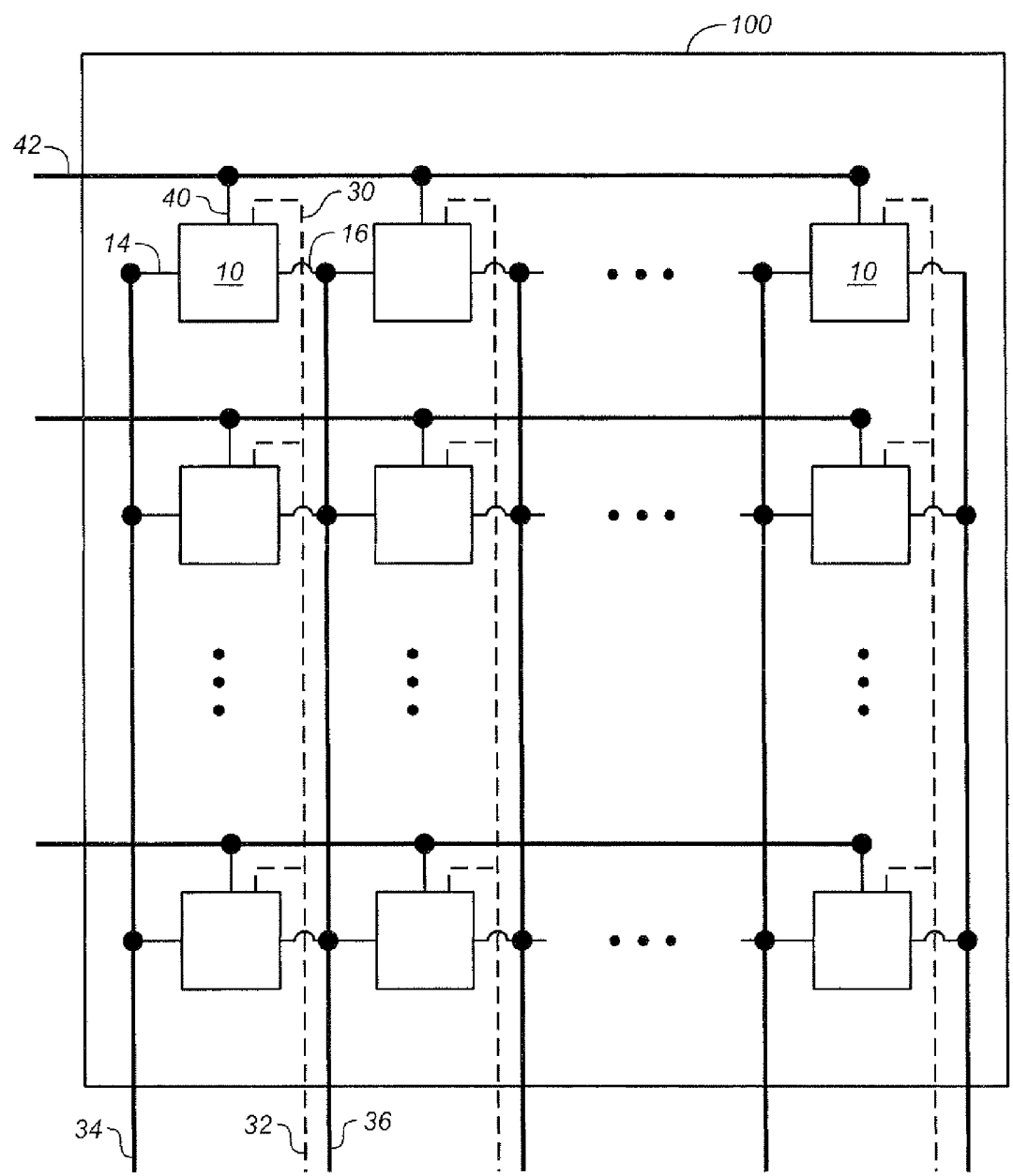
FIG. 2 illustrates an example of an NOR array of memory cells.
Figure 3:
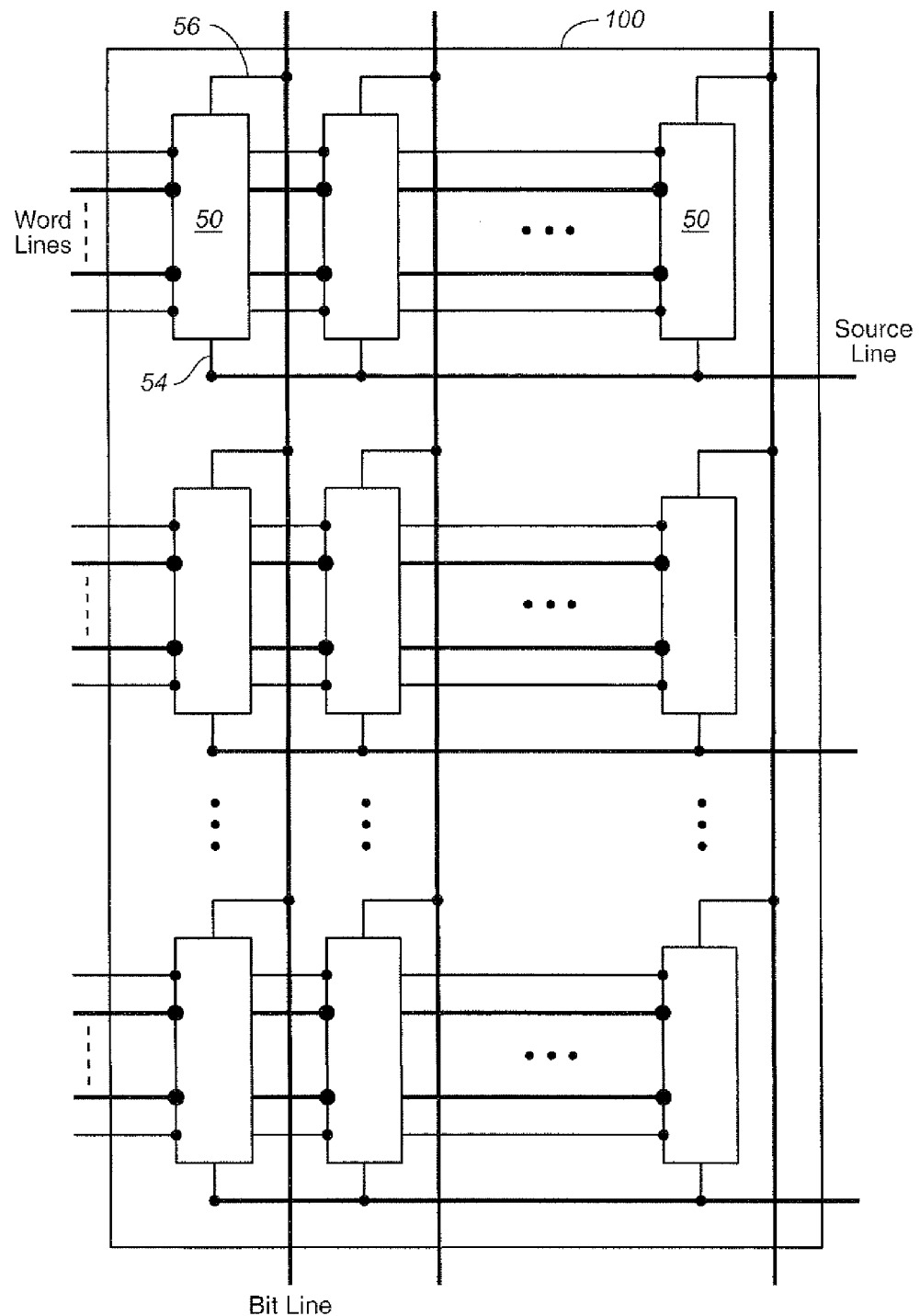
FIG. 3 illustrates an example of an NAND array of memory cells, such as that shown in FIG. 1D.
Figure 4:
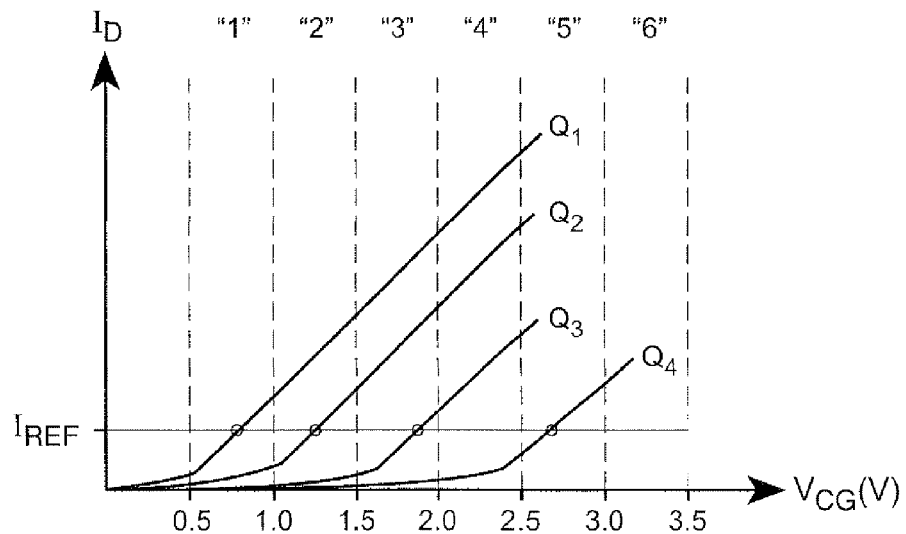
FIG. 4 illustrates the relation between the source-drain current and the control gate voltage for four different charges Q1-Q4 that the floating gate may be storing at any one time.
Figure 5:
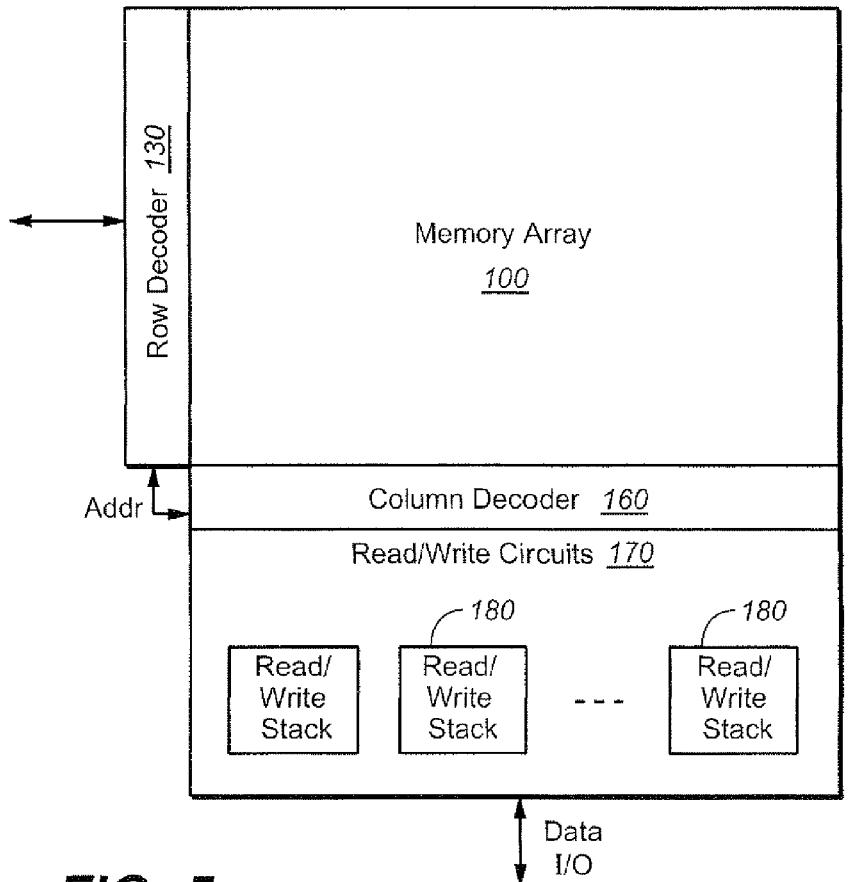
FIG. 5 illustrates schematically a typical arrangement of a memory array accessible by read/write circuits via row and column decoders.
Figure 6A:
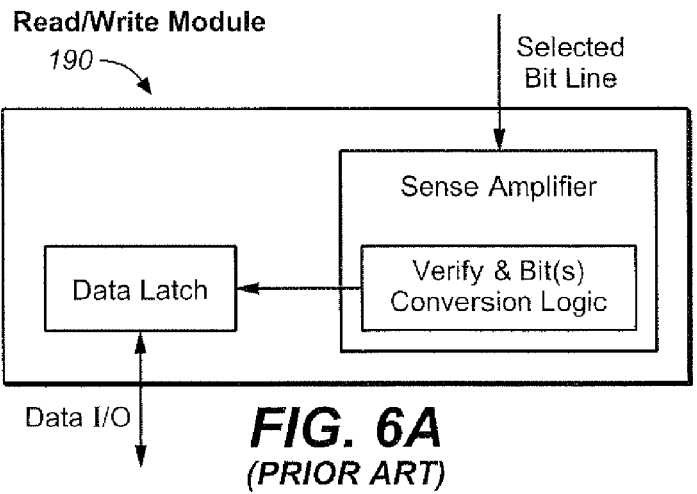
FIG. 6A is a schematic block diagram of an individual read/write module.
Figure 6B:
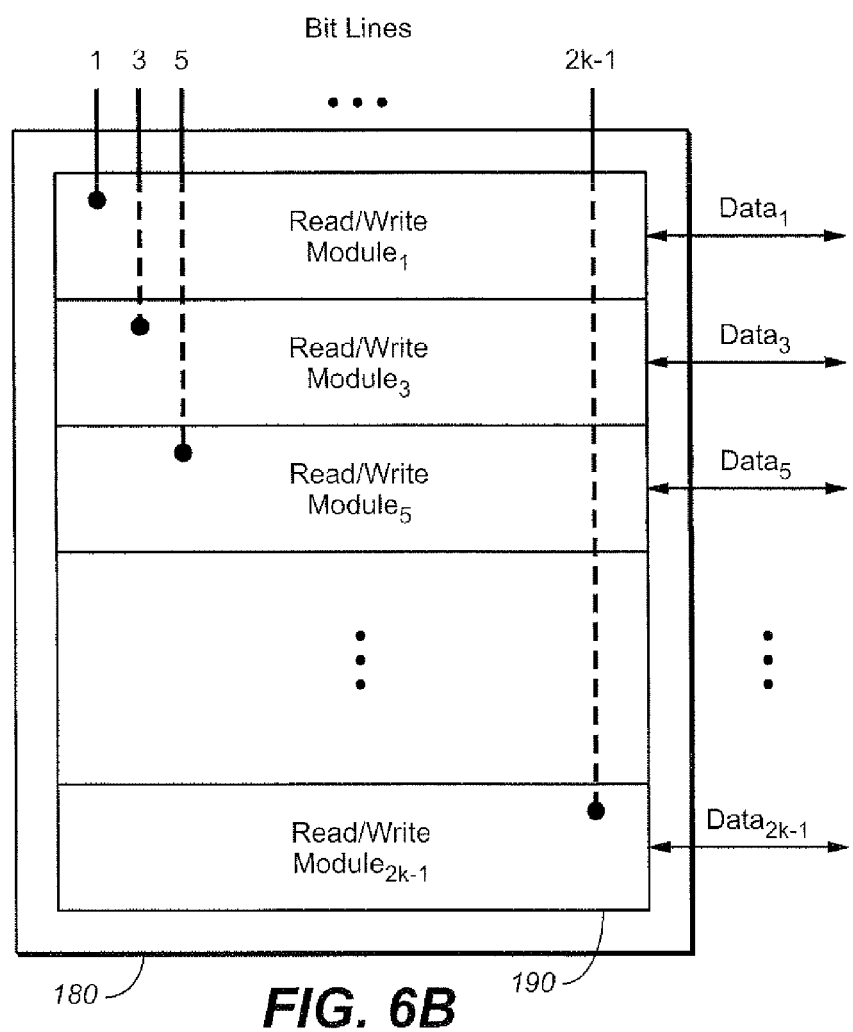
FIG. 6B shows the read/write stack of FIG. 5 implemented conventionally by a stack of read/write modules.

When an error occurs in a memory cell, some errors are more likely than others. For example, in the case of a floating gate memory where data states correspond to the amount of charge stored on the floating gate (see FIG. 4 above), if an error arises in a cell, it is more likely that the data state will have shifted into an adjacent state than a more distant state. Such knowledge of the physical characteristics of the memory device can be incorporated into error correction code (ECC). For example, the different possible error transitions that could happen in a cell could be weighted according to their relative physical likelihood and these weighting factors can be incorporated into ECC computation. This sort of ECC will be called "Strong ECC" or "SECC" in the following. Additional background detail on these subjects, including ECC that considers the relationship between the various states of a cell and how this can be used in error correction code, can be found in the following US patents, patent publications, and patent application numbers: 2009/0094482; U.S. Pat. No. 7,502,254; 2007/0268745; 2007/0283081; U.S. Pat. Nos. 7,310,347; 7,493,457; 7,426,623; 2007/0220197; 2007/0065119; 2007/0061502; 2007/0091677; 2007/0180346; 2008/0181000; 2007/0260808; 2005/0213393; U.S. Pat. Nos. 6,510,488; 7,058,818; 2008/0244338; 2008/0244367; 2008/0250300; and 2008/0104312.

In a preferred embodiment, when the data is rewritten from binary into multi-state format, state dependent strong ECC (SECC) will be used. To compute the SECC, the system needs to know how the data will be stored once written in multi-state format; and to know this, all of this data needs to be available. In the folding arrangement presented here and outlined in FIGS. 13 and 14, as data comes in, it is written in binary format along word line 613, followed by the next logical page on word line 615, and so on through the rest of the data set. Each word line has all the data that, after folding, will be written into N-bit multi-state format along 1/Nth of a physical multi-state page; for example, in FIG. 14 all of the data to be stored in the left third of word line 623 is word line 613. According to another aspect presented here, the strong ECC corresponding to how the logical page will be subsequently stored in multi-state form is computed in the controller (or host) and transferred along with the data and written in binary form. Thus, in FIG. 13 data on word line 613, for example, will already have SECC corresponding to how this logical page of data will be stored on a portion of word line 623. Note that the logical page of user data stored in the binary block will consequently be written in binary format, but the corresponding ECC written onto the physical page (or word line) with this user data will be based on its eventually multi-state disposition, even though it is yet to be written in this way.

In contrast, if N bits lines were written into binary format along N word lines and then rewritten in N-bit format on a single word line maintaining the bit line correspondence without the folding operation (e.g., 3 cells on the same bit line for 3 different binary block word lines end up in the same cell in the multi-state block 621), the controller could not compute the strong ECC unless it had all N logical pages at one time. Thus it would either need to accumulate them before writing them to binary form, removing the ability to rapidly write the data in binary format as it is received; or it would have to do a first write of the N logical pages in binary format, subsequently come back are read these pages back to the controller and compute the corresponding SECC, rewrite them in binary format along with the SECC, and then write the data and SECC in a multi-state block. Although this last arrangement would still allow the fast initial binary write, it would require an extra read and transfer back to the controller followed by a transfer back to the memory and second binary write. Note that in addition to the extra transfer time involved in this process, it would also double (from N to 2N) the number of word lines subjected to a binary write before each N logical pages ends up stored in multi-state format. Another disadvantage of using many (2N) word lines in a binary block to write the one word line on N bits per cell block is that the reliability of the flash memory may be limited by the reliability of the binary block; also, the use of too many blocks for binary programming would leave less memory capacity for storage of user data.

As noted above, as the data comes in from the host, it can be written in binary format, being accumulated in binary blocks until eventually rewritten in multi-state blocks. However, data packets will arrive from the host in various sizes, not typically corresponding to an integral number of logical pages. When the host load is less than a full logical page, a preferred embodiment can still transfer this data to the memory and program it into a binary block without ECC using a partial page programming. The controller can also keep the accumulated data for this partial pages until it has the amount corresponding to a full logical page, calculate the strong ECC based on this full page, and then write the SECC for the full accumulated logical page with this last chunk programmed in to fill out the logical page on the word line. The SECC location within the binary page may be important, so that some bit space can be left for the last program to fill all the SECC space. For example, in some cases the host may not have enough data to the whole page. In this case, the existing partial page data can be written in the binary block first with the binary ECC code. When the subsequent data comes in, the programmed binary partial page may be read back and form a whole page with the incoming data and programmed to another binary word line with SECC.

Defects may also need to be considered as part of the folding process. In particular, as the folding process takes data on multiple bits lines from a binary block and folds them on to a single bit line, any column defects of the source (binary) block of the memory array will be reflected in the folding process. (A discussion of defective columns and methods for dealing with these is given in U.S. Pat. No. 7,170,802.) For example, under one arrangement, referring back to FIG. 14, if a defective column is being skipped in, say, 613*a*, the corresponding columns in 613*b* and 613*c* to be folded in on word line 623 with the bad column will need to be skipped as 613*b* and 613*c* are written The bad column in the binary block should be skipped during binary page program. If there is bad column in the 1/N th page, then the binary page data should skip N bits in the binary page program. Additional bad columns in other areas of the word line will only require to be take care of in the binary page program.

Local Bus for Use in Data Folding

This section presents a structure that adds more data transfer ability to the sort of memory structures described above. Referring back to FIG. 15 above, this shows one of the read/write stacks used in the exemplary embodiments. The embodiments presented in this section add local internal data bus that connects to the SBuses 705 of different stacks so that data can be transferred between the registers of the different stacks. In an exemplary embodiment where the binary data is read out and then programmed back in with 3-bits per cell, the read/write stacks are split into three groups where the internal stack buses of the stacks in each group are connected by such a local bus.

As described above, the programming of pages storing multi-state (MLC) data are rearranged so that data from one binary page is distributed to different MLC pages. As previously described, in prior art arrangements the controller reads out the data, rearranges the data in the controller, and then writes the data back to memory for programming. This section and the previous section present techniques that remove the need of transferring data out and back into the memory by rearranging the data inside the memory, thereby improving the memory performance. Another benefit described above is that this arrangement can relieve the system of programming the binary pages with standard ECC before programming the Strong ECC (SECC) binary pages, reducing the endurance requirement for binary cache blocks by a factor of 2. In the preceding sections, which are developed further in U.S. patent application Ser. No. 12/478,997, the method of folding the data, such as is shown in FIG. 14, does not correspond to how the controller typically encodes the data. The structures introduced in this section allow for the data to be arranged in a way that is likely more beneficial for the controller.

Reviewing the previously presented approaches a little further, without the use of the internal data folding mechanism, in order to rewrite the binary data into multi-state format using Strong ECC (SECC) systems, data from the host is first written to binary format using standard or Light ECC (LECC) pages first. Once there are enough LECC pages, the data is read back out to the controller, which will convert the LECC pages into SECC binary pages. Once there are enough SECC binary pages, the binary pages then are "folded" into MLC pages. For example for in a 3-bit per cell multi-state format, 3 SECC binary pages are needed in order to fold into one 3-bit page. Similarly, for a 4-bit per cell four, 4 SECC binary pages are needed in order to fold into 1 D4 pages. This mechanism is called Background Internal Folding (BGIF).

The previous section presented an implementation where the folding can be done on the memory without transferring the data out to the controller. Instead, the folding is done within the stack bus (SBus and DBus 717, FIG. 15). The present section introduces a local bus within a group of a small number of read/write stacks so that data can be shuffled between the different stacks without the need of a data in or data out operation. Such an arrangement can be particularly useful when the number of levels or tiers used in the registers (as discussed above with respect to FIGS. 15 and 16) is not divisible by the number of MLC states (e.g., for 8 tiers and 3-bit per cell storage in MLC mode).

Figure 17:
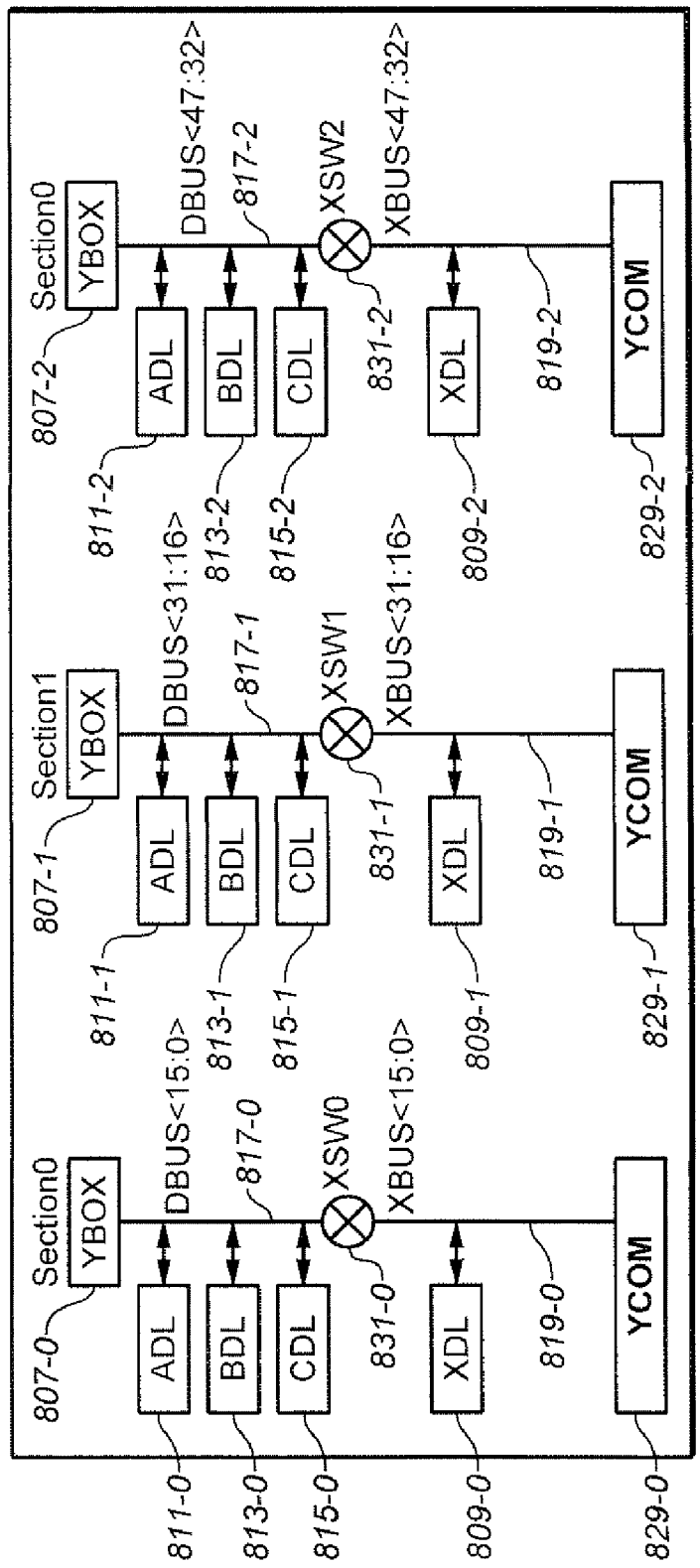
FIG. 17 is a block diagram of the register structure of FIG. 15 for several sections of the memory.

FIG. 17 shows several of the read/write stacks, each of which corresponds to FIG. 15 for the case M=15, but for the purposes of this discussion, the elements have been turned back upside down, with the sense amp SA 701 of FIG. 15 not being explicitly shown and now including the input/output module YCOM 821 that is connected to the input/output bus (also not shown here, but see FIGS. 8-10 above). Rather than the pair of latches UDL 711 and LDL 713 of FIG. 15, each of the stacks in FIG. 17 has the three sets of latches ADL 811, BDL 813, and CDL 815 and the present discussion will be based on a embodiment where the multi-levels writing will store 3-bits per cell. The bit lines of the memory are divided up into sections, each having its own such stack. For example, each stack could be responsible for 128 bit lines, corresponding to N=128 in FIG. 15. FIG. 17 shows the stacks of three of these sections (here section 0, 1, 2), but a memory will typically have many more sections. In a 3-bit MLC design, there are typically the shown 4 data latches, or more, connected together through DBUS/XBUS 817/819. As previously discussed, data transfer operations for the array are through YBOX 807. XBUS 819 is also connected to YCOM 821 for data in and data out operations. Under this arrangement, data can not be transferred across different sections.

Figure 18:
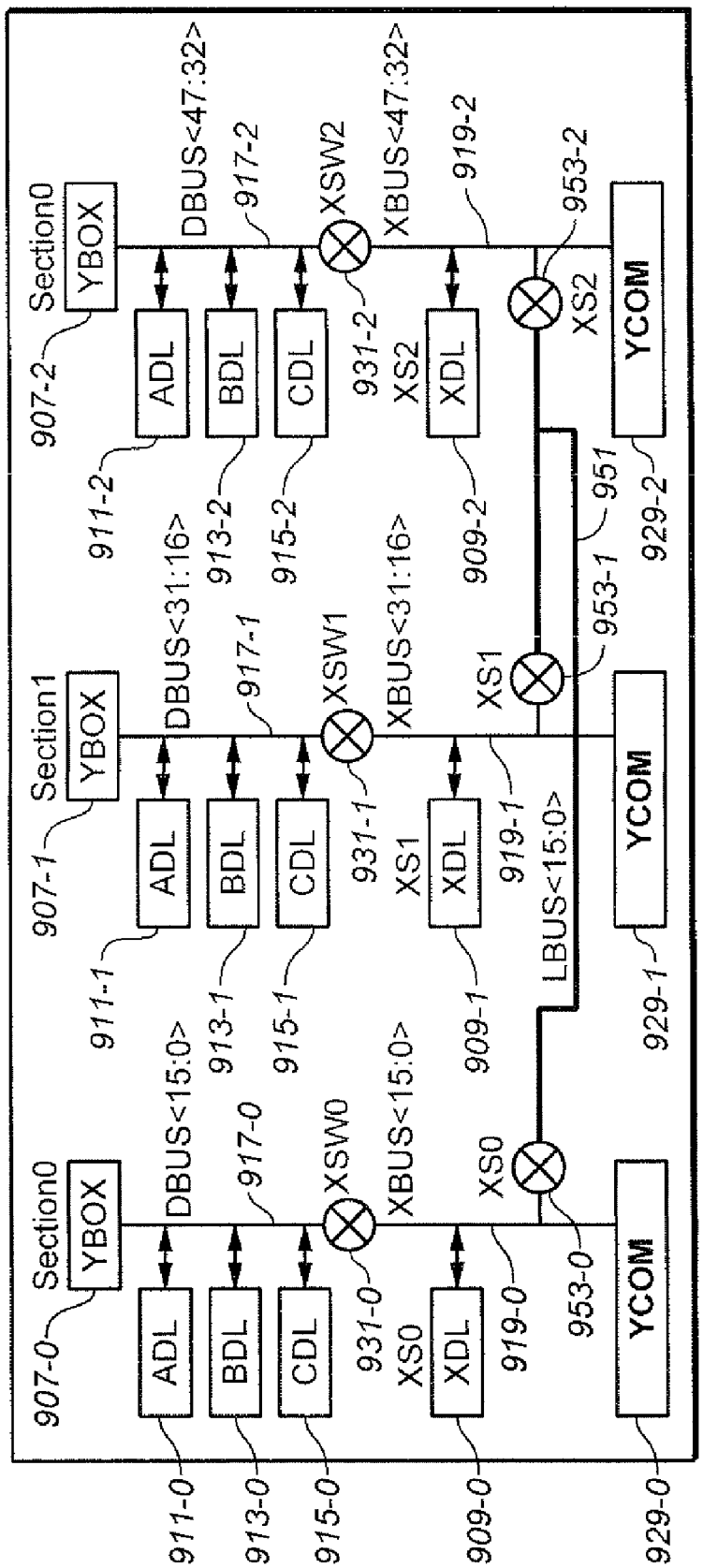
FIG. 18 adds a local data bus between the stack buses for a sub-set of the sections.

FIG. 18 repeats the elements of FIG. 17, which are similarly numbered, but adds a local data bus between the stack buses of a subset of the plurality of read/write stacks, giving the memory abilities to transfer data between different sections or columns. This increases the ways data can be rearranged and shuffled inside the memory itself without the intervention from controller. In the exemplary embodiment, this local data bus connects the stack buses of three stacks. (Again, only three sections are shown, but this arrangement would be repeated through each of the subsets of three stacks.)

This local bus is shown in FIG. 18 as LBUS 951, whose width (here 16 bits) matches that of the stack buses. Signals XSW0, XSW1, XSW2 are independent control signals, as are S0 at 953-0, S1 at 953-1, and S2 at 953-2, these signals select how the bus (XBUS and LBUS) are connected between different sections. Signal XS0, XS1, XS2 are also independent signals that control which section's XDL can receive data from other sections. By controlling the timing of these signals, data from one section can be transferred into another section. The horizontal data transfer ability between sections combined with the previously described vertical data transfer ability between the registers within a section to give the memory more flexibility for data transfer and rearrangement with the latches ADL 811, BDL 813, CDL 815, XDL 809. (Although not explicitly shown in FIG. 18, the YBOX 907 and sense amp of the stack typically also include a latch.)

Figure 19:
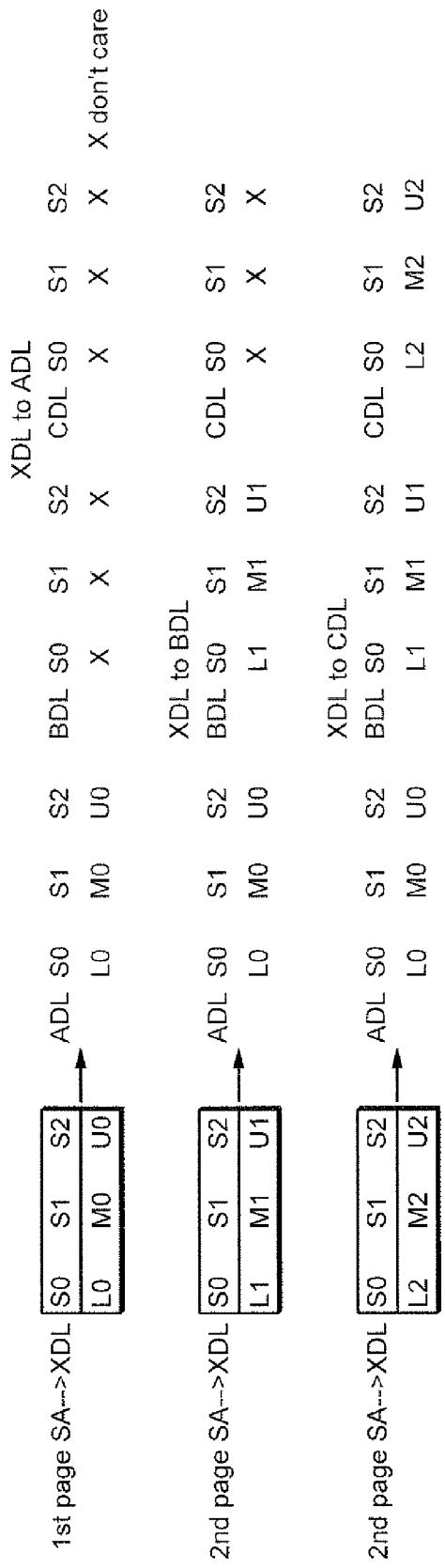
FIG. 19 illustrates the read process for several binary pages.

An example of the desired data rearrangement when rewriting three binary pages into one (physical) page of the memory in 3 bit per cell format using the arrangement of FIG. 18 is now given. To program a 3 bit page of data, three page binary data needs to be read from binary block and put into ADL, BDL, and CDL, as is illustrated in FIG. 19. Starting at the top line, the process begins by sensing a first binary page (page 0) at the sense amps and latches the result in XDL latches. The results for sections 0, 1, and 2 (S0, S1, S2) are labeled L0, M0, U0, corresponding the lower, middle, and upper into which they are to be rearranged. These are then transferred from the XDL register into the ADL register of each stack. The second binary page (page 1) follows and is stored in BDL, with the third binary page (page 2) being transferred from XDL to CDL. At the end of the process, the contents of the ADL, BDL, and CDL latches for each of the three sections is shown on the left side of FIG. 20.

Figure 20:
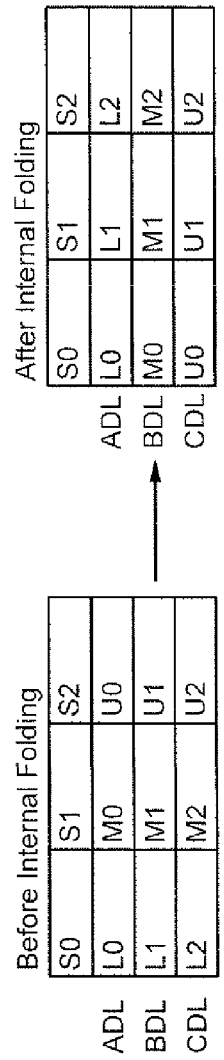
FIG. 20 is an example of how the data is folded internally within the latches.

Before discussing FIG. 20 further, the folding process is reconsidered. Referring back to FIG. 14, this shows a folding operation where the a binary page, say page 0 corresponding to wordline 613, is divided into thirds so that the portion 613*a* ends up on the upper page, the middle portion 613*b* ends up on the middle page, and 613*c* ends up on the lower page when the page is folding and rewritten in 3-bit MLC format on wordline 623. For a given cell, under the folding arrangement shown in FIG. 14, although the upper, middle and lower bit come from the same wordline, the binary cells that they come from are separated by a third of the wordline. This is often not how the controller encodes the data. More commonly, the controller deals in data encoded in units of a byte or several bytes or words. For example, consider the case when the controller encodes the data in 2-byte units. Because of this, it would be preferable to slice up the binary wordlines into 2-byte units, instead of thirds, and fold the page based on these smaller units. Thus, when folded, the first (physical) 2-byte segment of N=3 wordline 623 will have its upper, middle and lower byte taken from the first, second, and third 2-bytes, respectively, from binary wordline 613, with the rest of the three binary wordline similarly folded in two byte units. This folding, based on smaller units of memory cells, can be accomplished through use of LBUS 951.

This finer grained folding also helps to facilitate the encoding of the data with strong ECC. To encode the data with SECC, the controller needs to know the eventual data values for all the data to be stored on a cell in MLC format. When the binary page is folded in thirds, the controller will not have all of the data intended for a given MLC cell until its bit from the last third of the binary page comes in. If the data is instead folded in smaller units, all of the data to be folded into a given MLC cell arrives in closer proximity, thereby facilitating the SECC generation process. (Again, this is in the context of a 3-bit MLC example.)

Returning to FIG. 20, at the end of the binary described above with respect to FIG. 19, the data read into the registers ADL, BDL, and CDL for sections 0, 1 and 2 (S0, S1, S2) is as shown at left of FIG. 20. The desired result at the end of the folding process is shown at right, with the lower, middle and upper date for each section now respectively in the ADL, BDL, and CDL resister of that section. This transposing of the elements is done by transferring the data between the sections using the LBUS 951 that connects the three sections as shown in FIG. 18. The rest of the binary pages 0, 1, and 2 will similarly be read out into the registers of the other sections and similarly folded within each subset of sections. Once the data has been folded, it can then be programmed into the a wordline in an MLC block as the lower, middle, and upper pages.

One of the possible sequences of doing this data folding is shown in FIGS. 21A-M. After reading the binary page data, data latches have the initial data as shown in FIG. 21A, where XDL and latch of the sense amps (SA) still hold the data of the last page read. In the first pair of steps, U0 is moved from ADL of section 2 to the XDL latch of section 0 (FIG. 21B) and U1 is moved from S2's BDL latch to the XDL latch of section 1 through the intra-section transfers using the local internal data bus (LBUS) between the internal stack buses. As the upper pages units complete in XDL for all the sections, they are then shifted up into CDL (FIG. 21D). In the exemplary sequence used here, the latch in the stack processing circuit (YBOX), with the content of the BDL latch being sifted there in FIG. 21E The data corresponding to the middle page are then shifted into XDL from ADL of section 1 (FIG. 21F), the SA latch of section 1 (FIG. 21G), and the BDL latch of section 1 (FIG. 21H). The middle page is then shifted up to the BDL latches (FIG. 21I). The data corresponding to the lower page are then shifted into XDL from sense amp latch of section 0 (FIG. 21J), the YBOX latch of section 0 (FIG. 21K), and the ADL latch of section 0 (FIG. 21L). The lower page is then shifted up to the ADL latches (FIG. 21M).

After these steps, the data are thus rearranged and can programmed into the 3-bit per cell MLC blocks thereafter. Since no need to shift out and shift in data from the memory to the controller, the write performance is again improved and with the data encoded more advantageously for the controller. In this example given here, three sections are used for simplifying the description of this invention; more generally, a N number of sections can be grouped together, where N can be 2, 3, 4, 5, etc. Within the group, data can be transferred from one section to another section and rearranged in each of these subsets of the sections using the internal bus between the stack buses of the sections. And although the exemplary embodiment used for this discussion is for a 3-bit lower/middle/upper page data folding, different data rearrangements can similarly be accomplished inside the flash memory by using other embodiments of these techniques for improving memory performance.

Conclusion

Although the various aspects of the present invention have been described with respect to certain embodiments, it is understood that the invention is entitled to protection within the full scope of the appended claims.

What is claimed is:

1. A method of operating a non-volatile memory system including a non-volatile memory circuit having an array of non-volatile memory cells formed along a plurality of word lines and a plurality of bit lines, the bit lines forming a plurality of subsets each connectable to a corresponding set of data registers, the method comprising:
reading data stored in a binary format along a first word line in a first plurality of the memory cells formed along a plurality N of the subsets into a first register in each of the corresponding N sets of data registers; and
subsequently transferring into registers of a first of the N sets of data registers the data from the first registers of the other (N−1) sets of registers along a local internal data bus.

2. The method of claim 1, further comprising:
subsequently writing in an N-bit per cell format along a second word line the data from the registers of the first of the N sets of data registers into memory cells along the bit lines corresponding to the first of the N sets of data registers.

3. The method of claim 1, wherein the memory array is formed of a plurality of individually erasable block and the first of the word lines is in a first of the erase blocks and the second of the word lines is in a second of the erase block.

4. The method of claim 1, where the non-volatile memory system further includes a controller circuit, the method further comprising:
transferring the data from the controller circuit to the memory circuit prior to writing the data along the first word line in the first plurality of the memory cells.

5. The method of claim 4, further comprising:
prior to transferring the data from the controller circuit to the memory circuit:
receiving data at the controller;
generating within the controller a corresponding error correction code for the data, where the corresponding error correction code is generated dependent upon how the data is arranged into multistate format when programmed into the second word line; and
wherein the corresponding error correction code is transferred to the memory and written along the first word line in a binary format concurrently with data.

6. A method of operating a non-volatile memory system including a non-volatile memory circuit having an array of non-volatile memory cells formed along a plurality of word lines and a plurality of bit lines, the bit lines forming a plurality of subsets each connectable to a corresponding set of data registers, the method comprising:
reading data stored in a binary format along N first word line in memory cells formed along N of the subsets into N registers in each of the corresponding N sets of data registers, wherein N is an integer greater than one;
subsequently shuffling data between the registers of different ones the N sets of data registers using a local internal data bus connecting the N sets of data registers; and
subsequently writing in an N-bit per cell format along a second word line the shuffled data from the N sets of data registers.

7. The method of claim 6, wherein the memory array is formed of a plurality of individually erasable block and the first word lines are in a first of the erase blocks and the second of the word lines is in a second of the erase block.

8. The method of claim 6, where the non-volatile memory system further includes a controller circuit, the method further comprising:
transferring the data from the controller circuit to the memory circuit prior to writing the data along the first word lines.

9. The method of claim 8, further comprising:
prior to transferring the data from the controller circuit to the memory circuit:
receiving data at the controller;
generating within the controller a corresponding error correction code for the data, where the corresponding error correction code is generated dependent upon how the data is arranged into multistate format when programmed into the second word line; and
wherein the corresponding error correction code is transferred to the memory and written along the first word lines in a binary format concurrently with data.

* * * * *